(12) United States Patent
Choi et al.

(10) Patent No.: US 11,579,734 B2
(45) Date of Patent: *Feb. 14, 2023

(54) TOUCH SENSOR AND DISPLAY DEVICE HAVING THE SAME

(71) Applicant: Samsung Display Co., Ltd., Yongin-si (KR)

(72) Inventors: Deok Young Choi, Yongin-si (KR); Jin Yup Kim, Yongin-si (KR); Dan Bee Seong, Yongin-si (KR); Chae Young Sung, Yongin-si (KR); Ha Gyeong Song, Yongin-si (KR); Hyun Ki Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,918

(22) Filed: Jan. 10, 2022

(65) Prior Publication Data

US 2022/0244811 A1 Aug. 4, 2022

Related U.S. Application Data

(63) Continuation of application No. 16/891,051, filed on Jun. 3, 2020, now Pat. No. 11,221,718.

(30) Foreign Application Priority Data

Jul. 8, 2019 (KR) .................. 10-2019-0082276

(51) Int. Cl.
G06F 3/044 (2006.01)

(52) U.S. Cl.
CPC .......... G06F 3/0445 (2019.05); G06F 3/0446 (2019.05)

(58) Field of Classification Search
CPC ........ G06F 3/017; G06F 3/0412; G06F 3/044; G06F 3/0445; G06F 3/0446;
(Continued)

(56) References Cited

U.S. PATENT DOCUMENTS

2012/0098787 A1 4/2012 Kim et al.
2012/0313905 A1 12/2012 Kang et al.
(Continued)

FOREIGN PATENT DOCUMENTS

| KR | 10-2018-0119198 | 11/2018 |
| KR | 10-2018-0131761 | 12/2018 |
| KR | 10-2019-0025798 | 3/2019 |

OTHER PUBLICATIONS

Extended European Search Report dated Dec. 1, 2020, issued in European Patent Application No. 20184575.7.
(Continued)

Primary Examiner — Kenneth Bukowski
(74) Attorney, Agent, or Firm — H.C. Park & Associates, PLC

(57) ABSTRACT

A touch sensor including a base layer including a sensing area and a non-sensing area, first and second sensor patterns disposed in the sensing area and arranged along first and second directions, respectively, first bridge patterns arranged along the first direction, second bridge patterns arranged along the second direction, and sensing lines disposed in the non-sensing area and connected to each of the first and second sensor patterns, in which each of the sensing lines includes a first metal layer and a second metal layer with an insulating layer interposed therebetween, each of the sensing lines has a first portion and a second portion, the second portion corresponding to at least one of the first bridge patterns disposed at a corner portion of the sensing area, and
(Continued)

the second portion of at least one of the sensing lines has a single layer structure including only the second metal layer.

16 Claims, 19 Drawing Sheets

(58) Field of Classification Search
CPC .............. G06F 3/04164; G06V 10/26; G06V 10/462; G06V 10/245; G06V 40/20; G06V 30/19107; G06V 30/19113
See application file for complete search history.

(56) References Cited

U.S. PATENT DOCUMENTS

| | | |
|---|---|---|
| 2014/0182894 A1 | 7/2014 | Liu et al. |
| 2016/0070394 A1 | 3/2016 | Van Ostrand et al. |
| 2017/0249039 A1 | 8/2017 | Kim |
| 2018/0182822 A1 | 6/2018 | Seo et al. |
| 2018/0308903 A1 | 10/2018 | Jeong et al. |
| 2018/0348913 A1 | 12/2018 | Lee et al. |
| 2018/0350884 A1 | 12/2018 | Won et al. |
| 2019/0074328 A1 | 3/2019 | Park |

OTHER PUBLICATIONS

Non-Final Office Action dated Jan. 6, 2021, in U.S. Appl. No. 16/891,051.
Final Office Action dated Apr. 15, 2021, in U.S. Appl. No. 16/891,051.
Advisory Action dated Jun. 25, 2021, in U.S. Appl. No. 16/891,051.
Notice of Allowance dated Sep. 7, 2021, in U.S. Appl. No. 16/891,051.

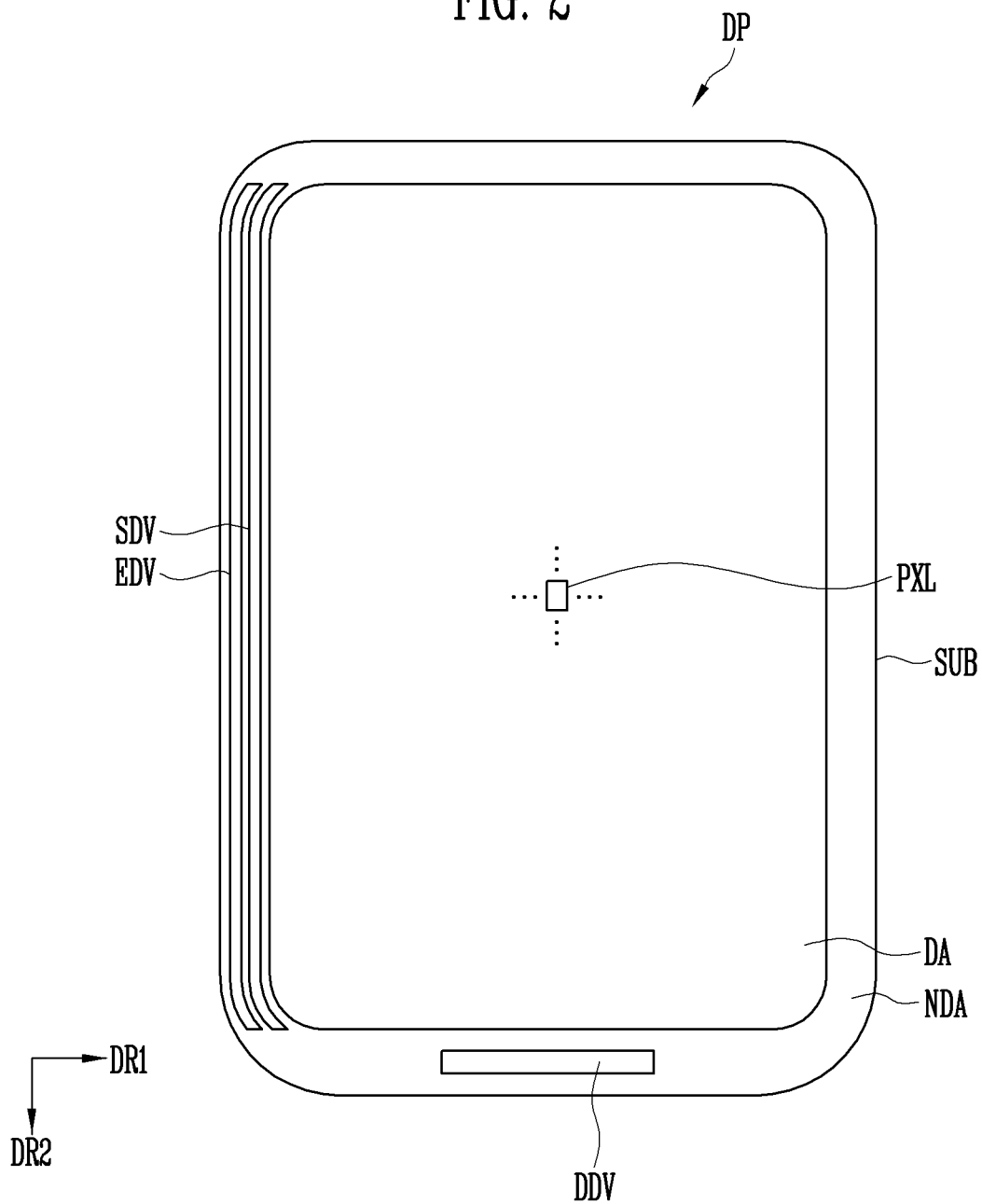

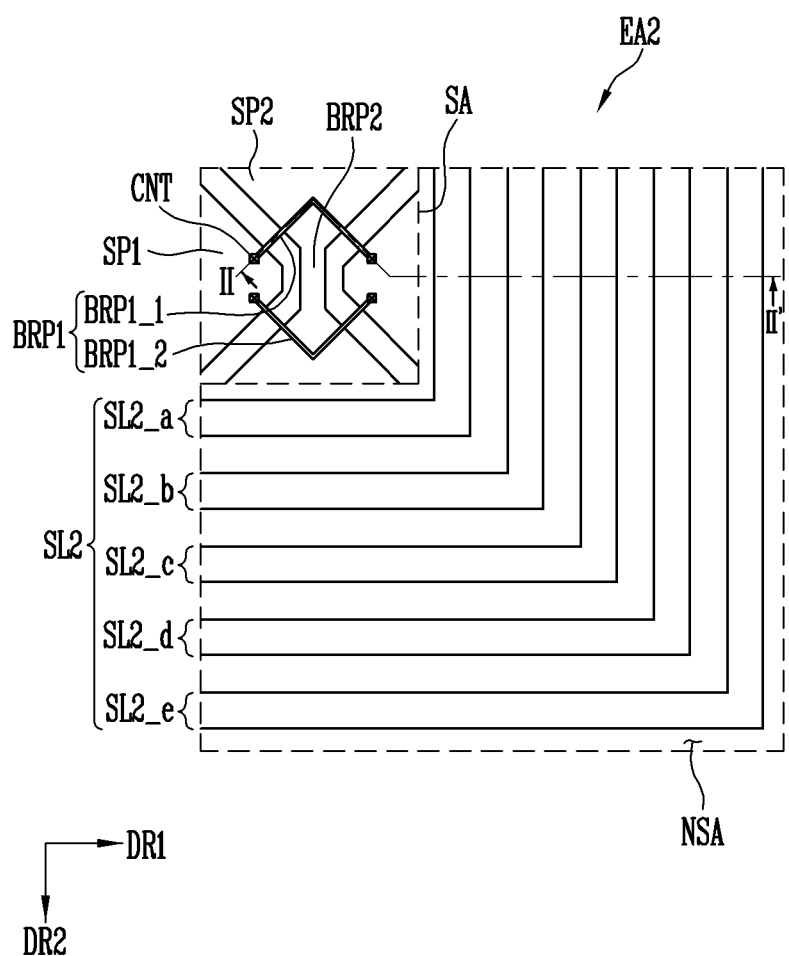

TOUCH SENSOR AND DISPLAY DEVICE HAVING THE SAME

CROSS-REFERENCE TO RELATED APPLICATIONS

This application is a Continuation of U.S. patent application Ser. No. 16/891,051, filed on Jun. 3, 2020, which claims priority from and the benefit of Korean Patent Application No. 10-2019-0082276, filed on Jul. 8, 2019, each of which is hereby incorporated by reference for all purposes as if fully set forth herein.

BACKGROUND

Field

Exemplary embodiments of the invention relate generally to a touch sensor and a display device having the same.

Discussion of the Background

A touch sensor is a type of information input device, and may be provided and used in a display device. For example, the touch sensor may be attached to one surface of a display panel or may be manufactured integrally with the display panel. A user may input information by pressing or touching the touch sensor while viewing an image displayed on a screen of the display device.

The touch sensor may include a sensing area provided with sensor patterns and a non-sensing area provided with sensing lines. In this case, differences in density of electrode patterns per unit area may be present in the sensing area provided with the sensor patterns and the non-sensing area provided with the sensing lines. Due to the density difference of electrode patterns per unit area in the sensing area and the non-sensing area, some components of the sensor patterns disposed in a specific area of the sensing area, for example, the width (or thickness) of a bridge, may be reduced. If the width of the bridge is reduced, short defects may occur in the specific area of the sensing area, thereby reducing the sensing sensitivity of the touch sensor.

The above information disclosed in this Background section is only for understanding of the background of the inventive concepts, and, therefore, it may contain information that does not constitute prior art.

SUMMARY

Touch sensors constructed according to exemplary embodiments of the invention and display devices including the same are capable of enhancing sensing sensitivity at a corner portion by forming at least one sensing line adjacent to a bridge located at the corner portion of the sensing area as a single layer including a metal layer different from the bridge, so that the density of electrode patterns per unit area in the sensing area is similar as that in the non-sensing area.

Additional features of the inventive concepts will be set forth in the description which follows, and in part will be apparent from the description, or may be learned by practice of the inventive concepts.

A touch sensor according to an exemplary embodiment includes a base layer including a sensing area and a non-sensing area, a plurality of first sensor patterns disposed in the sensing area and arranged along a first direction, a plurality of first bridge patterns arranged along the first direction, at least one of the first bridge patterns being disposed at a corner portion of the sensing area, a plurality of second sensor patterns disposed in the sensing area and arranged along a second direction crossing the first direction, a plurality of second bridge patterns arranged along the second direction, and a plurality of sensing lines disposed in the non-sensing area and connected to each of the first and second sensor patterns, in which each of the sensing lines includes a first metal layer and a second metal layer disposed on the first metal layer with an insulating layer interposed therebetween, each of the sensing lines has a first portion and a second portion, the second portion corresponding to the at least one of the first bridge patterns, and the second portion of at least one of the sensing lines has a single layer structure including only the second metal layer.

The first bridge patterns may be disposed on a layer different from a layer on which the first and second sensor patterns and the second bridge patterns are disposed.

The first metal layer may be disposed on the same layer as the first bridge patterns, and the second metal layer may be disposed on the same layer as the first and second sensor patterns and the second bridge patterns.

The insulating layer may include at least one contact hole, and the first metal layer and the second metal layer are electrically connected through the at least one contact hole.

The first portion of the at least one of the sensing lines may have a double layer structure including the first metal layer and the second metal layer overlapping the first metal layer.

The first portion of each of the sensing lines may have a double layer structure including the first metal layer and the second metal layer disposed on the first metal layer.

The first metal layer of each of the sensing lines may have the same size. The same size may include one of the same width, the same length, or the same thickness.

The first metal layer of each of the sensing lines may have a different size from each other.

The size of the first metal layer of each of the sensing lines may increase as being disposed further away from the sensing area.

The second portion of each of the sensing lines may have a single layer structure including only the second metal layer.

The second metal layer of each of the sensing lines may have the same size. The same size may include one of the same width, the same length, or the same thickness.

The second metal layer of each of the sensing lines may have a different size from each other.

The second portion may overlap the at least one of the first bridge patterns along the first direction.

Each of the sensing lines may include a third portion and a fourth portion extending in the first direction, the third portion may correspond to the first bridge patterns disposed in the same column as the at least one of the first bridge patterns, and the third portion may have a single layer structure including only the second metal layer.

The fourth portion of each of the sensing lines that does not correspond to the first bridge patterns disposed in the same column as the at least one of the first bridge patterns may have a double layer structure including the first metal layer and the second metal layer disposed on the first metal layer.

A display device according to another exemplary embodiment includes a display panel including a plurality of pixels and an encapsulating layer disposed on the plurality of pixels, each of the plurality of pixels including a light emitting element, and a touch sensor disposed on the encapsulating layer, the touch sensor including a base layer including a sensing area and a non-sensing area, a plurality of first sensor patterns disposed in the sensing area and arranged along a first direction, a plurality of first bridge patterns arranged along the first direction, at least one of the first bridge patterns being disposed at a corner portion of the sensing area, a plurality of second sensor patterns disposed in the sensing area and arranged along a second direction crossing the first direction, a plurality of second bridge patterns arranged along the second direction, and a plurality of sensing lines disposed in the non-sensing area and connected to each of the first and second sensor patterns, in which each of the sensing lines includes a first metal layer and a second metal layer disposed on the first metal layer with an insulating layer interposed therebetween, each of the sensing lines has a first portion and a second portion, the second portion corresponding to the at least one of the first bridge patterns, and the second portion of at least one of the sensing lines has a single layer structure including only the second metal layer.

The first metal layer may be disposed on the same layer as the first bridge patterns, and the second metal layer may be disposed on the same layer as the first and second sensor patterns and the second bridge patterns.

The first portion of each of the sensing lines may have a double layer structure including the first metal layer and the second metal layer disposed on the first metal layer.

The first metal layer of each of the sensing lines may have the same size. The same size may include one of the same width, the same length, or the same thickness.

The display panel may include a substrate including a display area provided with the plurality of pixels and a non-display area disposed on at least one side of the display area. Each of the plurality of pixels comprises a pixel circuit layer disposed on the substrate and including at least one transistor; and a display element layer disposed on the pixel circuit layer and including the light emitting element emitting light. The encapsulation layer may be disposed on the display element layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2 is a schematic plan view of a display panel of FIG. 1B.

FIG. 8 is an enlarged schematic plan view exemplarily illustrating a region EA2 of FIG. 5.

DETAILED DESCRIPTION OF THE ILLUSTRATED EMBODIMENTS

Figure 1A:
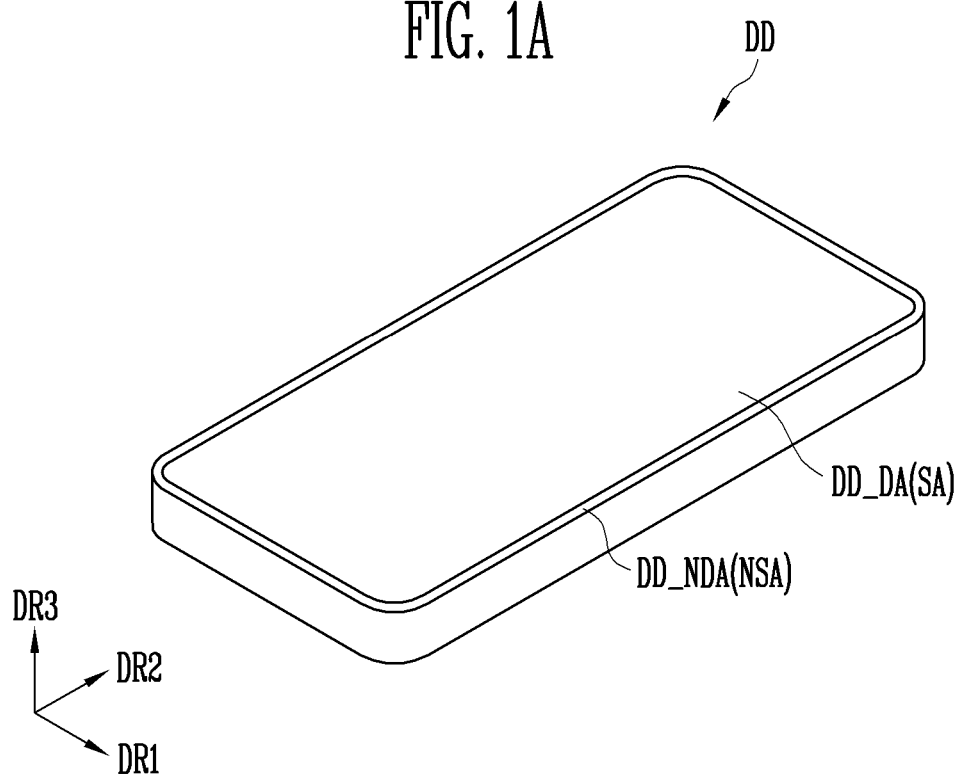
FIG. 1A is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
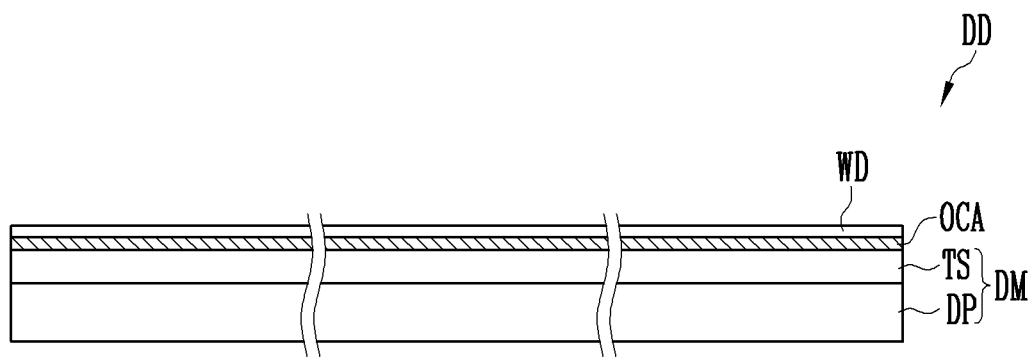
FIG. 1B is a schematic cross-sectional view of the display device of FIG. 1A.

FIG. 1A is a perspective view of a display device according to an exemplary embodiment. FIG. 1B is a schematic cross-sectional view of the display device of FIG. 1A.

Referring to FIGS. 1A and 1B, a display device DD may include a display module DM and a window WD.

The display device DD may be provided in various shapes. For example, the display device DD may be provided as a rectangular plate having two pairs of sides substantially parallel to each other. However, the inventive concepts are not limited thereto. For example, when the display device DD has a rectangular plate shape, one of two pairs of the sides may be longer than the other pair of the sides. Hereinafter, the display device DD will be described as having a rectangular shape that has a pair of long sides and a pair of short sides. An extension direction of the long sides is indicated by a second direction DR2, an extension direction of the short sides is indicated by a first direction DR1, and a direction perpendicular to the extension directions of the long side and the short side is indicated by a third direction DR3. As described above, in the display device DD having the rectangular plate shape, a corner portion where one long side and one short side meet each other may have a round shape.

According to an exemplary embodiment, at least a portion of the display device DD may have flexibility, and the display device DD may be folded at the portion having the flexibility.

The display device DD may include a display area DD_DA for displaying an image and a non-display area DD NDA provided on at least one side of the display area DD_DA. The non-display area DD NDA may be an area where no image is displayed.

In some exemplary embodiments, the display device DD may include a sensing area SA and a non-sensing area NSA. The display device DD may display an image through the sensing area SA, and may also detect light incident from the front. The non-sensing area NSA may surround the sensing area SA, but the inventive concepts are not limited thereto. In FIG. 1A, the sensing area SA is illustrated as having a shape that includes rounded corners and corresponding to the display area DD_DA. However, the inventive concepts are not limited thereto, and in some exemplary embodiments, a portion of the display area DD_DA may correspond to the sensing area SA.

The shape, size, and arrangement position of the sensing area SA of the display device DD described above may be variously modified according to sensor electrodes to be described later.

The display module DM may include a display panel DP and a touch sensor TS. The touch sensor TS may be disposed directly on the display panel DP or disposed on the display panel DP with a separate layer, such as an adhesive layer or a substrate, interposed therebetween.

The display panel DP may display an image. As the display panel DP, a display panel capable of self-emission, such as an organic light emitting diode (OLED) display panel, may be used. However, the inventive concepts are not limited thereto, and in some exemplary embodiments, a non-light emitting display panel, such as a liquid crystal display (LCD) panel, an electro-phoretic display (EPD) panel, and an electro-wetting display (EWD) panel, may be used as the display panel DP. When the non-light emitting display panel is used as the display panel DP, the display device DD may include a backlight unit that supplies light to the display panel DP.

The touch sensor TS may be disposed on a surface, on which the image of the display panel DP is emitted, to receive a user's touch input. The touch sensor TS may recognize a touch event of the display device DD through a user's hand or a separate input means. The touch sensor TS may recognize the touch event in a capacitance manner. However, the inventive concepts are not limited thereto, and in some exemplary embodiments, the touch sensor TS may detect the touch input in a mutual capacitance manner or in a self-capacitance manner.

A window WD may be provided on the display module DM to protect the exposed surface of the display module DM. The window WD may protect the display module DM from external shock, and provide a user with an input surface and/or a display surface. The window WD may be coupled to the display module DM by an optically clear adhesive (OCA) member.

The window WD may have a multi-layer structure, and may include at least one of a glass substrate, a plastic film, and a plastic substrate. The multi-layer structure may be formed through a continuous process or an adhesive process using an adhesive layer. All or part of the window WD may have flexibility.

FIG. 2 is a schematic plan view of the display panel of FIG. 1B.

Referring to FIGS. 1A, 1B and 2, the display panel DP may include a substrate SUB, pixels PXL provided on the substrate SUB, a driver disposed on the substrate SUB and driving the pixels PXL, and a wiring portion connecting the pixels PXL and the driver.

The substrate SUB may be formed as one part having substantially a rectangular shape. However, the inventive concepts are not limited thereto, and in some exemplary embodiments, the substrate SUB may be formed as multiple parts, and the substrate SUB may have a different shape depending on the number of parts of the substrate SUB.

The substrate SUB may include an insulating material, such as glass and resin. In addition, the substrate SUB may include a flexible material so as to be bent or folded, and may have a single layer structure or a multi-layer structure. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material forming the substrate SUB may be variously changed. For example, in some exemplary embodiments, the substrate SUB may include fiber glass reinforced plastic (FRP).

The substrate SUB may include a display area DA and a non-display area NDA. The display area DA may be an area, in which the pixels PXL are provided to display an image. The non-display area NDA may be an area, in which the pixels PXL are not provided, and thus, an image may not be displayed. Although only one pixel PXL is illustrated in FIG. 2, however, a plurality of pixels PXL may be disposed in the display area DA of the substrate SUB.

The display area DA of the display panel DP may correspond to the display area DD_DA of the display device DD, and the non-display area NDA of the display panel DP may correspond to the non-display area DD NDA of the display device DD.

The driver for driving the pixels PXL and a portion of the wiring portion connecting the pixels PXL and the driver may be provided in the non-display area NDA. The non-display area NDA may correspond to a bezel area of the display device DD.

The pixels PXL may be provided in the display area DA of the substrate SUB. Each of the pixels PXL may be a minimum unit for displaying an image. The pixels PXL may include an organic light emitting diode that emits white light and/or color light. Each of the pixels PXL may emit one of red, green, and blue colors. However, the inventive concepts are not limited thereto, and in some exemplary embodiments, the pixels PXL may emit color light, such as cyan, magenta, and yellow.

The pixels PXL may be arranged in a matrix form along a row extending in the first direction DR1 and a column extending in the second direction DR2 crossing the first direction DR1. However, the arrangement of the pixels PXL is not particularly limited, and may be arranged in various forms.

The driver may supply a signal to each of the pixels PXL through the wiring portion, and control the driving of the pixels PXL. In FIG. 2, the wiring portion is not illustrated, and the wiring portion will be described in more detail with reference to FIG. 3A.

The driver may include a scan driver SDV for transmitting a scan signal to each of the pixels PXL through a scan line, a light emission driver EDV for providing a light emission control signal to each of the pixels PXL through a light emission control line, and a data driver DDV providing a data signal to each of the pixels PXL through a data line, and a timing controller. The timing controller may control the scan driver SDV, the light emission driver EDV, and the data driver DDV.

Figure 3A:
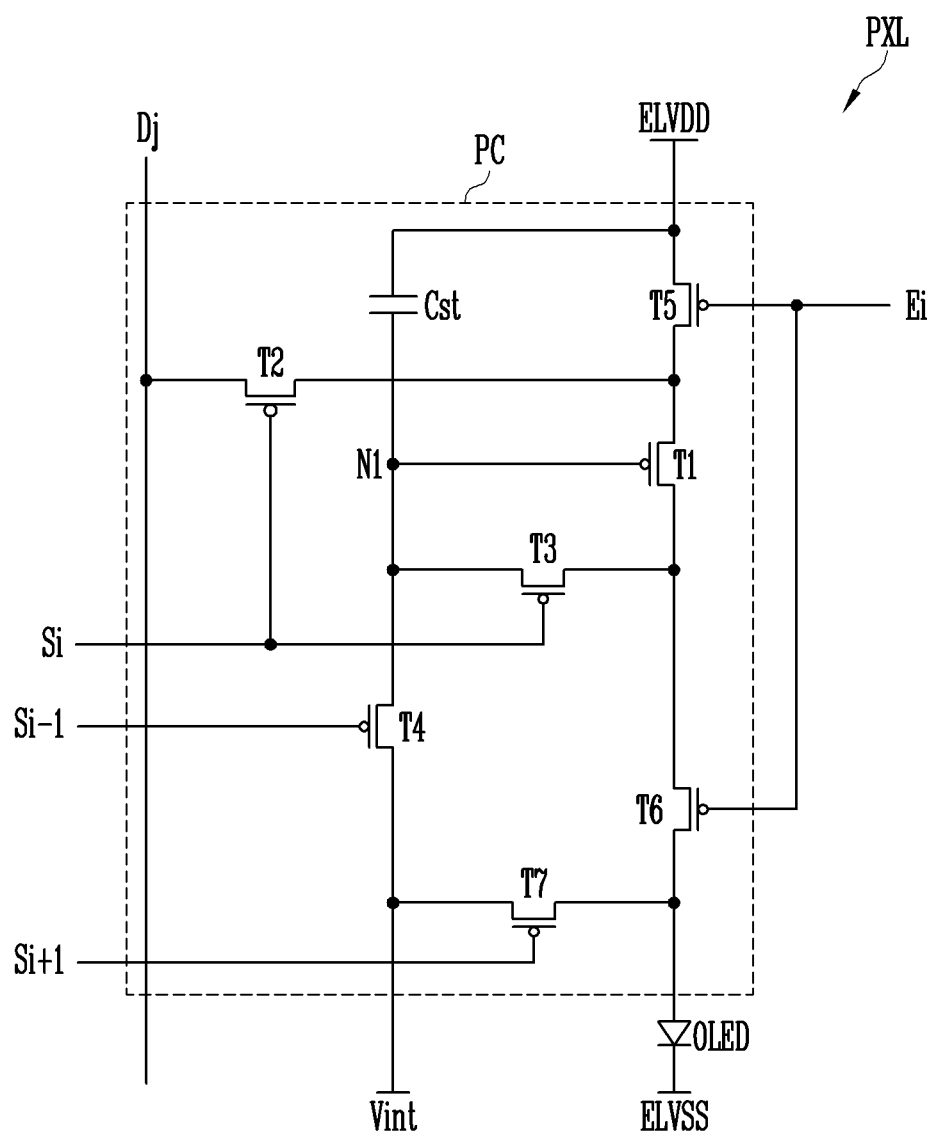
FIG. 3A is an equivalent circuit diagram illustrating an electrical connection relationship between components included in one pixel shown in FIG. 2.

FIG. 3A is an equivalent circuit diagram illustrating an electrical connection relationship between components included in one pixel shown in FIG. 2.

Referring to FIGS. 1A, 1B, 2 and 3A, each of the pixels PXL may include a light emitting element OLED and a pixel circuit PC for driving the light emitting element OLED. According to an exemplary embodiment, the light emitting element OLED may include an organic light emitting diode (OLED).

The pixel circuit PC may be connected to an $i^{th}$ scan line Si and a $j^{th}$ data line Dj of the corresponding pixel PXL. For example, when the pixel PXL is disposed in an $i^{th}$ ("i" is a natural number) row and a $i^{th}$ ("j" is a natural number) column of the display area DA of the display panel DP, the pixel circuit PC of the pixel PXL may be connected to the $i^{th}$ scan line Si and the $j^{th}$ data line Dj of the display area DA. In some exemplary embodiments, the pixel circuit PC may be further connected to at least one other scan line. For example, one pixel PXL disposed in the $i^{th}$ row of the display area DA of the display panel DP may be further connected to an $(i-1)^{th}$ scan line Si-1 and/or an $(i+1)^{th}$ scan line Si+1. In some exemplary embodiments, the pixel circuit PC may be further connected to a third power source in addition to first and second pixel power sources ELVDD and ELVSS. For example, the pixel circuit PC may be connected to an initialization power source Vint.

The pixel circuit PC may include first to seventh transistors T1 to T7 and a storage capacitor Cst.

One electrode of the first transistor T1 (for example, a driving transistor), for example, a source electrode may be connected to a power source line, to which the first pixel power source ELVDD is applied, via the fifth transistor T5, and another electrode, for example, a drain electrode, may be connected to the light emitting element OLED via the sixth transistor T6. A gate electrode of the first transistor T1 may be connected to a first node N1. The first transistor T1 may control a driving current flowing between the first pixel power source ELVDD and the second pixel power source ELVSS via the light emitting element OLED according to the voltage of the first node N1.

The second transistor T2 (for example, a switching transistor) may be connected between the $j^{th}$ data line Dj connected to the pixel PXL and the source electrode of the first transistor T1. A gate electrode of the second transistor T2 may be connected to the $i^{th}$ scan line Si connected to the pixel PXL. The second transistor T2 may be turned on when a scan signal of a gate-on voltage (for example, a low voltage) is supplied from the $i^{th}$ scan line Si to electrically connect the $j^{th}$ data line Dj to the source electrode of the first transistor T1. When the second transistor T2 is turned on, the data signal supplied from the $j^{th}$ data line Dj is transferred to the first transistor T1.

The third transistor T3 may be connected between the drain electrode of the first transistor T1 and the first node N1. A gate electrode of the third transistor T3 may be connected to the $i^{th}$ scan line Si. The third transistor T3 may be turned on when the scan signal of the gate-on voltage is supplied from the $i^{th}$ scan line Si to electrically connect the drain electrode of the first transistor T1 to the first node N1.

The fourth transistor T4 may be connected between the first node N1 and an initialization power source line, to which the initialization power source Vint is applied. A gate electrode of the fourth transistor T4 may be connected to a previous scan line, for example, the $(i-1)^{th}$ scan line Si-1. The fourth transistor T4 may be turned on when the scan signal of the gate-on voltage is supplied to the $(i-1)^{th}$ scan line Si-1 to transfer the voltage of the initialization power source Vint to the first node N1. Here, the initialization power source Vint may have a voltage less than or equal to the lowest voltage of the data signal.

The fifth transistor T5 may be connected between the first pixel power source ELVDD and the first transistor T1. A gate electrode of the fifth transistor T5 may be connected to a corresponding emission control line, for example, an $i^{th}$ emission control line Ei. The fifth transistor T5 may be turned off when an emission control signal of a gate-off voltage is supplied to the $i^{th}$ emission control line Ei, and may be turned on otherwise.

The sixth transistor T6 may be connected between the first transistor T1 and the light emitting element OLED. A gate electrode of the sixth transistor T6 may be connected to the $i^{th}$ emission control line Ei. The sixth transistor T6 may be turned off when the emission control signal of the gate-off voltage is supplied to the $i^{th}$ emission control line Ei, and may be turned otherwise.

The seventh transistor T7 may be connected between the light emitting element OLED and the initialization power source line, to which the initialization power source Vint is applied. A gate electrode of the seventh transistor T7 may be connected to any one of the next scan lines, for example, the $(i+1)^{th}$ scan line Si+1. The seventh transistor T7 may be turned on when the scan signal of the gate-on voltage is supplied to the $(i+1)^{th}$ scan line Si+1 to supply the voltage of the initialization power source Vint to the light emitting element OLED.

The storage capacitor Cst may be connected between the first pixel power source ELVDD and the first node N1. The storage capacitor Cst may store a voltage corresponding to a data signal supplied to the first node N1 in each frame period and a threshold voltage of the first transistor T1.

An anode electrode of the light emitting element OLED may be connected to the first transistor T1 via the sixth transistor T6, and a cathode electrode of the light emitting element OLED may be connected to the second pixel power source ELVSS. The light emitting element OLED may generate light having a predetermined luminance in response to the amount of current supplied from the first transistor T1. The voltage of the first pixel power source ELVDD may be set higher than that of the second pixel power source ELVSS, so that a current may flow to the light emitting element OLED. The potential difference between the first pixel power source ELVDD and the second pixel power source ELVSS may be set to be equal to or greater than a threshold voltage of the light emitting element OLED during an emission period of the pixel PXL.

Figure 3B:
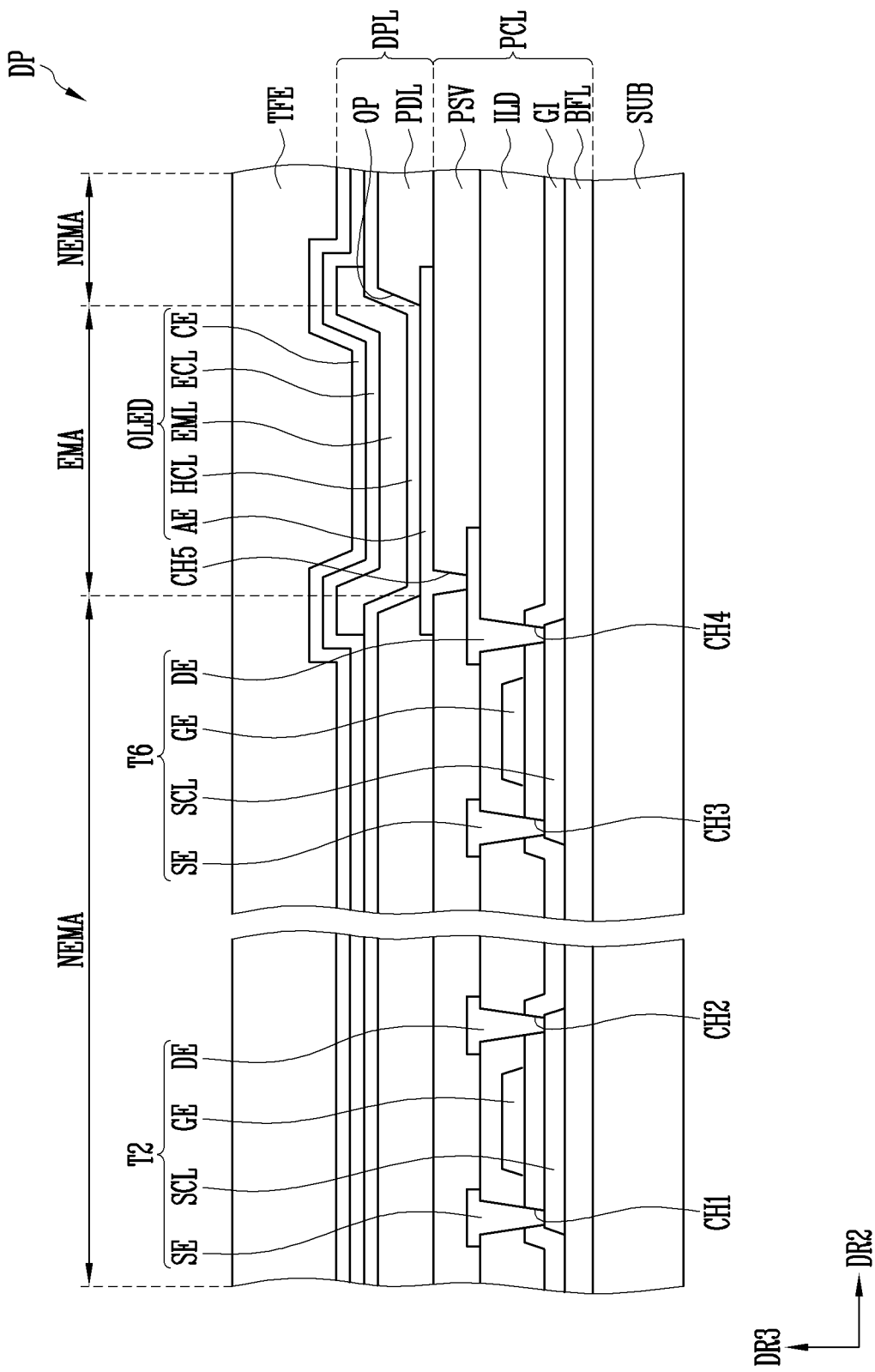
FIG. 3B is an enlarged cross-sectional view of a portion of the display panel of FIG. 2.

FIG. 3B is an enlarged cross-sectional view of a portion of the display panel of FIG. 2.

In FIG. 3B, only cross-sectional views of portions corresponding to the second and sixth transistors among the first to seventh transistors illustrated in FIG. 3A are exemplarily illustrated.

Referring to FIGS. 1A, 1B, 2, 3A and 3B, the display panel DP may include the substrate SUB, a pixel circuit layer PCL, a display element layer DPL, and a thin film encapsulation layer TFE.

The substrate SUB may include an insulating material, such as glass, organic polymer, quartz, or the like. In addition, the substrate SUB may include a flexible material so as to be bent or folded, and may have a single layer structure or a multi-layer structure.

The pixel circuit layer PCL may include a buffer layer BFL, the second and sixth transistors T2 and T6, and a passivation layer PSV.

The buffer layer BFL may be provided on the substrate SUB, and may prevent impurities from being diffused into the second and sixth transistors T2 and T6. The buffer layer BFL may be provided as a single layer or a multilayer of at least two or more layers. In some exemplary embodiments, the buffer layer BFL may be omitted depending on materials and process conditions of the substrate SUB.

Each of the second and sixth transistors T2 and T6 may include a semiconductor layer SCL, a gate electrode GE, a source electrode SE, and a drain electrode DE.

The semiconductor layer SCL of each of the second and sixth transistors T2 and T6 may be provided on the buffer layer BFL. The semiconductor layer SCL may include source and drain regions contacting the source electrode SE and the drain electrode DE, respectively. A region between the source region and the drain region may be a channel region.

The semiconductor layer SCL may be a semiconductor pattern including polysilicon, amorphous silicon, an oxide semiconductor, or the like. The channel region may be an intrinsic semiconductor pattern that is not doped with impurities. In this case, impurities, such as n-type impurities, p-type impurities, and metal impurities, may be used. The source and drain regions may be semiconductor patterns doped with impurities.

The gate electrode GE of each of the second and sixth transistors T2 and T6 may be provided on the corresponding semiconductor layer SCL with a gate insulating layer GI interposed therebetween.

The source electrode SE of each of the second and sixth transistors T2 and T6 may be in contact with the source region of the corresponding semiconductor layer SCL through a contact hole passing through an interlayer insulating layer ILD and the gate insulating layer GI. For example, the source electrode SE of the second transistor T2 may be in contact with the source region of the corresponding semiconductor layer SCL through a first contact hole CH1 passing through the interlayer insulating layer ILD and the gate insulating layer GI, and the source electrode SE of the sixth transistor T6 may be in contact with the source region of the corresponding semiconductor layer SCL through a third contact hole CH3 passing through the interlayer insulating layer ILD and the gate insulating layer GI.

The drain electrode DE of each of the second and sixth transistors T2 and T6 may be in contact with the drain region of the corresponding semiconductor layer SCL through a contact hole passing through the interlayer insulating layer ILD and the gate insulating layer GI. For example, the drain electrode DE of the second transistor T2 may be in contact with the drain region of the corresponding semiconductor layer SCL through a second contact hole CH2 passing through the interlayer insulating layer ILD and the gate insulating layer GI, and the drain electrode DE of the sixth transistor T6 may be in contact with the drain region of the corresponding semiconductor layer SCL through a fourth contact hole CH4 passing through the interlayer insulating layer ILD and the gate insulating layer GI.

According to an exemplary embodiment, each of the interlayer insulating layer ILD and the gate insulating layer GI may be formed of an inorganic insulating film including an inorganic material, or an organic insulating film including an organic material.

The passivation layer PSV may be provided on the second and sixth transistors T2 and T6 to cover the second and sixth transistors T2 and T6. The passivation layer PSV may include a fifth contact hole CH5 exposing a portion of the drain electrode DE of the sixth transistor T6 to the outside.

The display element layer DPL may include the light emitting element OLED provided on the passivation layer PSV and emitting light.

The light emitting element OLED may include first and second electrodes AE and CE and a light emitting layer EML provided between the first and second electrodes AE and CE. One of the first and second electrodes AE and CE may be the anode electrode, and the other may be the cathode electrode. For example, the first electrode AE may be the anode electrode and the second electrode CE may be the cathode electrode. When the light emitting element OLED is a top emission organic light emitting device, the first electrode AE may be a reflective electrode and the second electrode CE may be a transmissive electrode. Hereinafter, the light emitting element OLED will exemplarily be described as a top emission organic light emitting device, and in this case, the first electrode AE may be the anode electrode.

The first electrode AE may be electrically connected to the drain electrode DE of the sixth transistor T6 through the fifth contact hole CH5 penetrating the passivation layer PSV. The first electrode AE may include a reflective film capable of reflecting light, and a transparent conductive film disposed above or below the reflective film. At least one of the transparent conductive film and the reflective film may be electrically connected to the drain electrode DE of the sixth transistor T6.

The display element layer DPL may further include a pixel defining layer PDL having an opening OP that exposes a portion of the first electrode AE, for example, an upper surface of the first electrode AE.

Each pixel PXL provided in the display panel DP may be disposed in a pixel area included in the display area DA. According to an exemplary embodiment, the pixel area may include a light emitting area EMA and a non-light emitting area NEMA adjacent to the light emitting area EMA. The non-light emitting area NEMA may surround the light emitting area EMA. In the illustrated exemplary embodiment, the light emitting area EMA may be defined to correspond to a portion of the first electrode AE exposed by the opening OP.

The display element layer DPL may include a hole control layer HCL and an electron control layer ECL.

The hole control layer HCL may be disposed in common in the light emitting area EMA and the non-light emitting area NEMA. In some exemplary embodiments, a common layer, such as the hole control layer HCL, may be commonly formed in the plurality of pixels PXL.

The light emitting layer EML may be disposed on the hole control layer HCL. The light emitting layer EML may be disposed in a region corresponding to the opening OP. More particularly, the light emitting layer EML may be provided in each of the plurality of pixels PXL. The light emitting layer EML may include an organic material and/or an inorganic material. In the illustrated exemplary embodiment of the present invention, the light emitting layer EML is illustrated as being patterned in each pixel PXL, however, in some exemplary embodiments, the light emitting layer EML may be commonly provided in the pixels PXL. The color of light generated in the light emitting layer EML may be one of red, green, blue, and white, but the inventive concepts are not limited thereto. For example, the color of light generated in the light emitting layer EML may be one of magenta, cyan, and yellow.

The electron control layer ECL may be provided on the light emitting layer EML. The electron control layer ECL may be commonly formed in the pixels PXL, and may inject and/or transport electrons to the light emitting layer EML.

The second electrode CE may be provided on the electron control layer ECL. The second electrode CE may be commonly provided in the pixels PXL.

The thin film encapsulation layer TFE may be provided on the second electrode CE to cover the second electrode CE.

The thin film encapsulation layer TFE may be formed of a single layer, or multiple layers. The thin film encapsulation layer TFE may include a plurality of insulating layers covering the light emitting element OLED. In particular, the thin film encapsulation layer TFE may include at least one inorganic layer and at least one organic layer. For example, the thin film encapsulation layer TFE may have a structure, in which an inorganic layer and an organic layer are alternately stacked. In another exemplary embodiment, the thin film encapsulation layer TFE may be an encapsulation substrate disposed on the light emitting element OLED and bonded to the substrate SUB through a sealant.

Figure 4:
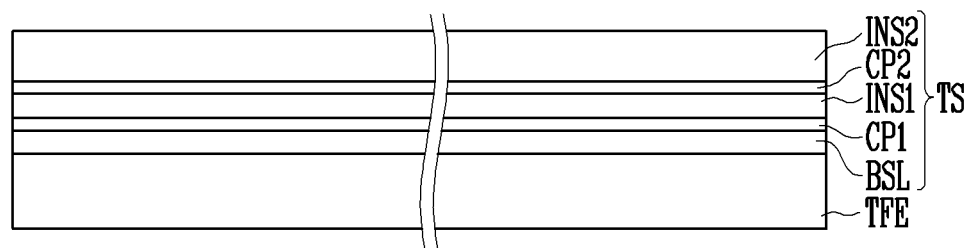
FIG. 4 is a schematic cross-sectional view of a touch sensor of FIG. 1B.

FIG. 4 is a schematic cross-sectional view of a touch sensor of FIG. 1B.

Referring to FIGS. 1A, 1B, 2, 3A, 3B and 4, the touch sensor TS may include a base layer BSL, a first conductive pattern CP1, a first insulating layer INS1, a second conductive pattern CP2, and a second insulating layer INS2.

The first conductive pattern CP1 may be directly disposed on the base layer BSL, which may be an insulation layer disposed between the first conductive pattern CP1 and the thin film encapsulation layer TFE of the display panel DP, but the inventive concepts are not limited thereto. In some exemplary embodiments, the first conductive pattern CP1 may be disposed directly on the thin film encapsulation layer TFE of the display panel DP. In some exemplary embodiments, the base layer BSL may be an uppermost layer of the thin film encapsulation layer TFE.

Each of the first and second conductive patterns CP1 and CP2 may have a single layer structure or a multi-layer structure stacked in a thickness direction. The conductive pattern of the single layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium tin zinc oxide (ITZO), or the like. In addition, the transparent conductive layer may include PEDOT, metal nanowires, and graphene.

The conductive pattern of the multi-layer structure may include multi-layered metal layers. The multi-layered metal layers may have a triple-layer structure, for example, titanium/aluminum/titanium. The conductive pattern of the multi-layer structure may include a single metal layer and a single transparent conductive layer. The conductive pattern of the multi-layer structure may include multi-layered metal layers and multi-layered transparent conductive layers.

According to an exemplary embodiment, each of the first and second conductive patterns CP1 and CP2 may include sensor patterns and sensing lines.

Each of the first insulating layer INS1 and the second insulating layer INS2 may include an inorganic insulating film including an inorganic material, or an organic insulating film including an organic material. The inorganic insulating film may include at least one of aluminum oxide, titanium oxide, silicon oxide, or silicon nitride, silicon oxynitride, zirconium oxide, and hafnium oxide. The organic insulating film may include at least one of acrylic resin, methacrylic resin, polyisoprene, vinyl resin, epoxy resin, urethane resin, cellulose resin, siloxane resin, polyimide resin, polyamide resin, and perylene resin.

Figure 5:
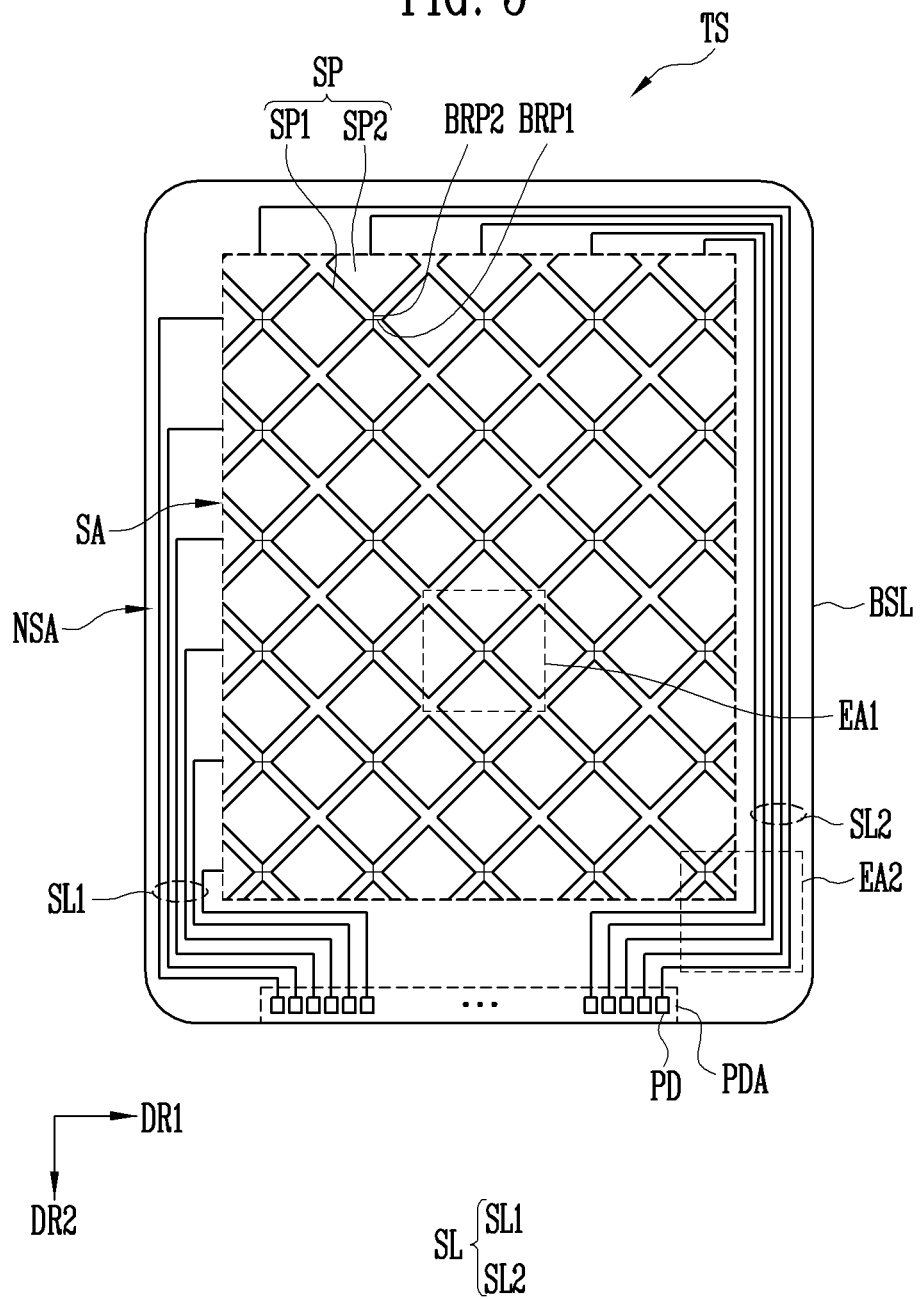
FIG. 5 is a schematic plan view of the touch sensor of FIG. 1B.
Figure 6:
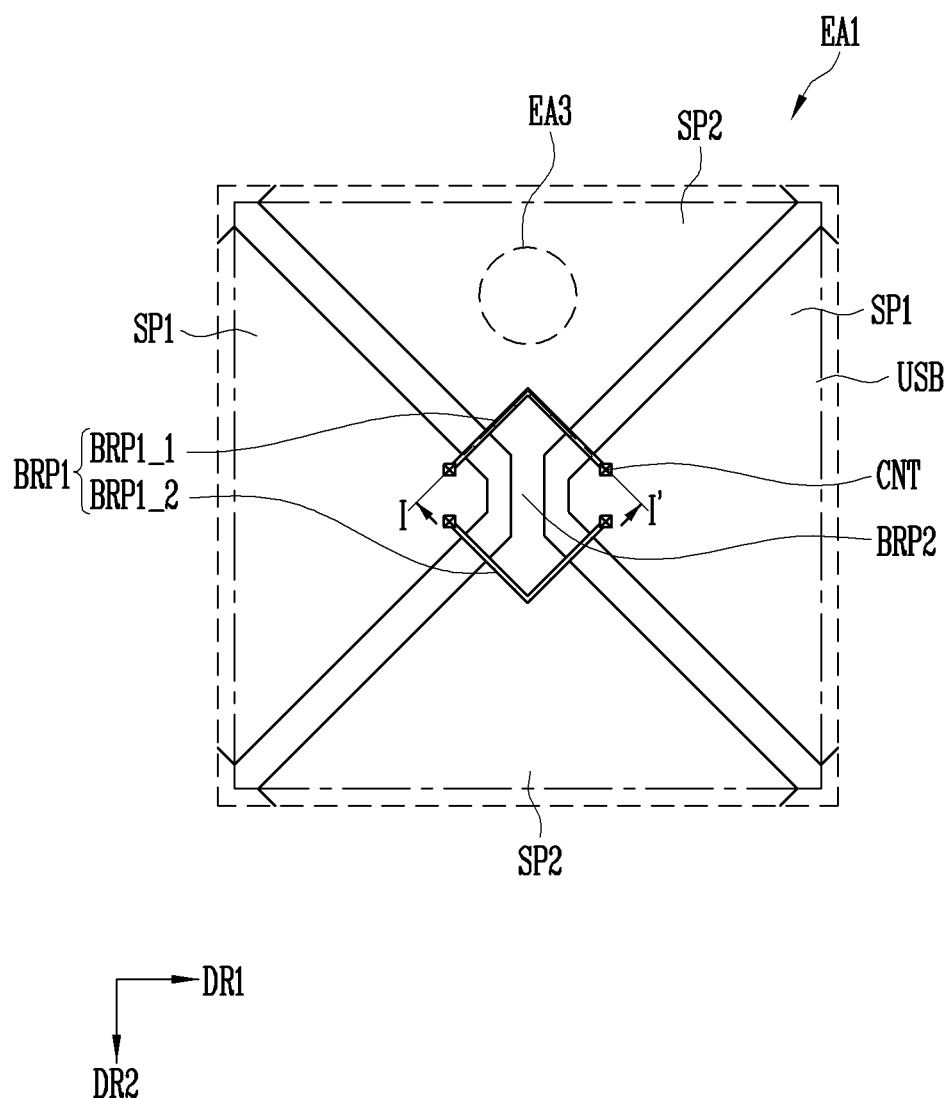
FIG. 6 is an enlarged schematic plan view exemplarily illustrating a region EA1 of FIG. 5.
Figure 7A:
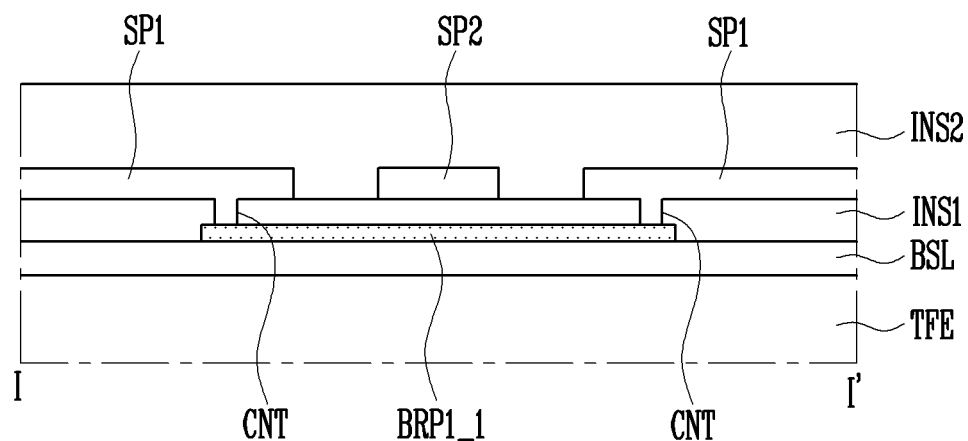
FIG. 7A is a cross-sectional view taken along line I-I' of FIG. 6.
Figure 7B:
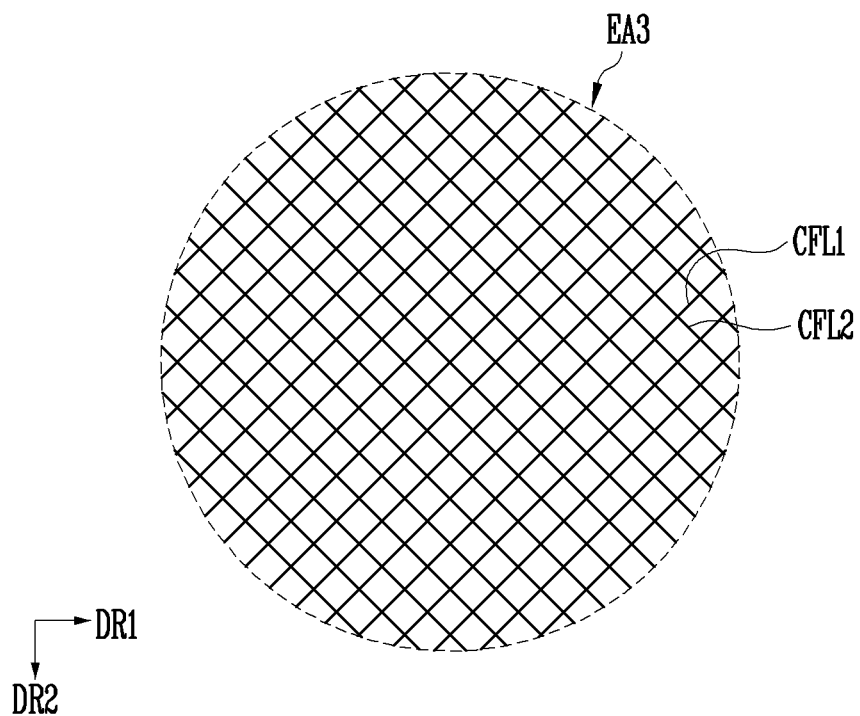
FIG. 7B is an enlarged schematic plan view exemplarily illustrating a region EA3 of FIG. 7A.

FIG. 5 is a schematic plan view of the touch sensor of FIG. 1B. FIG. 6 is an enlarged schematic plan view exemplarily illustrating a region EA1 of FIG. 5. FIG. 7A is a cross-sectional view taken along line I-I' of FIG. 6. FIG. 7B is an enlarged schematic plan view exemplarily illustrating a region EA3 of FIG. 7A.

Referring to FIGS. 1A to 7B, the touch sensor TS may include the base layer BSL including the sensing area SA capable of sensing a touch input, and the non-sensing area NSA surrounding at least a portion of the sensing area SA.

The base layer BSL may be made of tempered glass, transparent plastic, transparent film, or the like.

The sensing area SA may be provided in a center area of the base layer BSL and overlap the display area DA of the display panel DP. The sensing area SA may have substantially the same shape as that of the display area DA, but the inventive concepts are not limited thereto. Sensor electrodes for sensing a touch input are provided and/or formed in the sensing area SA.

The non-sensing area NSA may be provided at an edge of the base layer BSL and overlap the non-display area NDA of the display panel DP. Sensing lines SL electrically connected to the sensor electrodes to receive and transmit a touch sensing signal may be provided and/or formed in the non-sensing area NSA. In addition, a pad portion PDA connected to the sensing lines SL and electrically connected to the sensor electrodes of the sensing area SA may be disposed in the non-sensing area NSA. The pad portion PDA may include a plurality of pads PD.

The sensor electrode may include a plurality of sensor patterns SP and first and second bridge patterns BRP1 and BRP2.

The sensor patterns SP may include a plurality of first sensor patterns SP1 and a plurality of second sensor patterns SP2 electrically insulated from the first sensor patterns SP1.

The first sensor patterns SP1 may be arranged in the first direction DR1 and electrically connected to the adjacent first sensor patterns SP1 by the first bridge patterns BRP1 to form at least one sensor row. The second sensor patterns SP2 may be arranged in the second direction DR2 crossing the first direction DR1 and electrically connected to the adjacent second sensor patterns SP2 through the second bridge patterns BRP2 to form at least one sensor column.

Each of the first and second sensor patterns SP1 and SP2 may be electrically connected to each pad PD through the corresponding sensing line SL.

According to an exemplary embodiment, the touch sensor TS may recognize a user's touch by sensing the amount of change in the capacitance formed between the first and second sensor patterns SP1 and SP2.

According to an exemplary embodiment, each of the second sensor patterns SP2 may include a plurality of conductive thin lines CFL1 and CFL2 as shown in FIG. 7B. For example, the second sensor patterns SP2 may include the plurality of first conductive thin lines CFL1 parallel to each other and extending in an oblique direction with respect to the first direction DR1, and the plurality of second conductive thin lines CFL2 parallel to each other and extending in an oblique direction with respect to the second direction DR2. Due to the first conductive thin lines CFL1 and the second conductive thin lines CFL2, each of the second sensor patterns SP2 may have a mesh structure. The mesh structure may include a plurality of openings, for example, regions in which the first conductive thin lines CFL1 and the second conductive thin lines CFL2 cross each other.

In the drawing, each of the second sensor patterns SP2 is illustrated as having a mesh structure, but the inventive concepts are not limited thereto. For example, in some exemplary embodiments, the first sensor patterns SP1 and the first and second bridge patterns BRP1 and BRP2 may also have a mesh structure including the first and second conductive thin lines CFL1 and CFL2.

When the first and second sensor patterns SP1 and SP2 have a mesh structure, an area where the first and second sensor patterns SP1 and SP2 overlap the display panel DP may be reduced by the openings. In this manner, electromagnetic interference between the first and second sensor patterns SP1 and SP2 and the display panel DP may be prevented or at least be suppressed.

Each of the first bridge patterns BRP1 electrically connects the first sensor patterns SP1 arranged side by side along the first direction DR1. Each of the first bridge patterns BRP1 may also be provided to extend in the first direction DR1. Each of the first bridge patterns BRP1 may include a $(1-1)^{th}$ bridge pattern BRP1_1 and a $(1-2)^{th}$ bridge pattern BRP1_2.

Each of the second bridge patterns BRP2 electrically connects the second sensor patterns SP2 arranged side by side along the second direction DR2. Each of the second bridge patterns BRP2 may also be provided to extend in the second direction DR2. According to an exemplary embodiment, the second bridge patterns BRP2 may be integrally provided with the second sensor patterns SP2. When the second bridge patterns BRP2 are integrally provided with the second sensor patterns SP2, the second bridge patterns BRP2 may be one region of the second sensor patterns SP2.

The touch sensor TS may include the first conductive pattern CP1 disposed on the base layer BSL as shown in FIG. 4, the first insulating layer INS1 disposed on the first conductive pattern CP1, the second conductive pattern CP2 disposed on the first insulating layer INS1, and the second insulating layer INS2 disposed on the second conductive pattern CP2.

The base layer BSL may be disposed on the thin film encapsulation layer TFE of the display panel DP. The base layer BSL may include an organic insulating film including an organic material, or an inorganic insulating film including an inorganic material. In an exemplary embodiment, the base layer BSL may include a material that is flexible so as to be bent or folded, and may have a single layer structure or a multi-layer structure. In order to implement a touch screen function, the touch sensor TS may be combined with the display panel DP displaying an image. Accordingly, the touch sensor TS may have transparency that may transmit light.

In some exemplary embodiments, the base layer BSL may be an uppermost layer of the thin film encapsulation layer TFE of the display panel DP. For example, the base layer BSL may be an inorganic insulating layer (or an inorganic layer) that is an uppermost layer of the thin film encapsulation layer TFE. In some exemplary embodiments, the base layer BSL may be an inorganic insulating layer (e.g., inorganic buffer layer) additionally disposed on the thin film encapsulation layer TFE. For example, the base layer BSL may include a silicon nitride layer, a silicon oxy nitride layer, a silicon oxide layer, a titanium oxide layer, an aluminum oxide layer, or the like.

The first conductive pattern CP1 may be directly disposed on the base layer BSL. In some exemplary embodiments, the first conductive pattern CP1 may be disposed to overlap the pixel defining layer PDL.

The first conductive pattern CP1 may include the first bridge patterns BRP1 as shown in FIGS. 6 and 7A.

The first conductive pattern CP1 may include a conductive material. The conductive material may include a transparent conductive oxide or a metal material. In addition, the first conductive pattern CP1 may include a plurality of stacked metal layers. Examples of the transparent conductive oxide include indium tin oxide (ITO), indium zinc oxide (IZO), antimony zinc oxide (AZO), indium tin zinc oxide (ITZO), zinc oxide (ZnO), and tin oxide ($SnO_2$). Examples of the metal material include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, and lead. The first conductive pattern CP1 may have a single layer structure or a multi-layer structure.

The first insulating layer INS1 may be provided on the first conductive pattern CP1. The first insulating layer INS1 may include substantially the same material as the base layer BSL, without being limited thereto. In an exemplary embodiment, the first insulating layer INS1 may include an organic insulating film including an organic material, or an inorganic insulating film including an inorganic material.

The second conductive pattern CP2 may include a single conductive material layer or a plurality of stacked conductive material layers as similar to the first conductive pattern CP1. As shown in FIGS. 4, 6, and 7A, the second conductive pattern CP2 may include first and second sensor patterns SP1 and SP2, and second bridge patterns BRP2 provided on the first insulating layer INS1. The first sensor patterns SP1 adjacent in the first direction DR1 may be electrically and/or physically connected to each other by the first bridge patterns BRP1 formed in contact holes CNT passing through the first insulating layer INS1.

The second insulating layer INS2 may be disposed on the first insulating layer INS1, on which the second conductive pattern CP2 is disposed. The second insulating layer INS2 may prevent the second conductive pattern CP2 from being exposed to the outside, thereby preventing corrosion of the second conductive pattern CP2. The second insulating layer INS2 may be formed of an organic insulating film including an organic material. The organic material may include one of acryl, polyimide (PI), polyamide (PA), and benzocyclobutene (BCB). The second insulating layer INS2 made of an organic insulating film may be transparent and have fluidity, so that the curvature of the lower structure may be alleviated and flattened. In some exemplary embodiments, the second insulating layer INS2 may be formed of an inorganic insulating film including an inorganic material.

According to the illustrated exemplary embodiment, the first bridge patterns BRP1 is described as being included in the first conductive pattern CP1, and the first and second sensor patterns SP1 and SP2 and the second bridge patterns BRP2 are described as being included in the second conductive patterns CP2, however, the inventive concepts are not limited thereto. In some exemplary embodiments, the first and second sensor patterns SP1 and SP2 and the second bridge patterns BRP2 may be included in the first conductive pattern CP1, and the first bridge patterns BRP1 may be included in the second conductive pattern CP2. More particularly, the first and second sensor patterns SP1 and SP2 and the second bridge patterns BRP2 may be formed and/or provided on the base layer BSL, and the first bridge patterns BRP1 may be formed and/or provided on first insulating layer INS1. Even in this case, each of the first sensor patterns SP1 may be connected to the corresponding first bridge patterns BRP1 through the contact hole CNT passing through the first insulating layer INS1, and may be electrically and/or physically connected to the first sensor patterns SP1 disposed adjacent to each other in the first direction DR1.

In an exemplary embodiment, the first conductive pattern CP1 may be provided on the base layer BSL, and the second conductive pattern CP2 may be provided on the first insulating layer INS1. However, the inventive concepts are not limited thereto. For example, in some exemplary embodiments, the first conductive pattern CP1 may be provided on the first insulating layer INS1, and the second conductive pattern CP2 may be provided on the base layer BSL.

In addition, the first and second sensor patterns SP1 and SP2 according to the illustrated exemplary embodiment are described as being disposed on the same layer, but the inventive concepts are not limited thereto. In some exemplary embodiments, the first sensor patterns SP1 and the second sensor patterns SP2 may be provided on different layers from each other.

The first and second sensor patterns SP1 and SP2 and the first and second bridge patterns BRP1 and BPR2 as described above may be formed of a light transmissive conductive layer, such as ITO, IZO, or ZnO.

The sensor electrode provided and/or formed in the sensing area SA may include dummy electrodes disposed to be spaced apart between the first and second sensor patterns SP1 and SP2. The dummy electrodes are not electrically connected to the first sensor patterns SP1 and the second sensor patterns SP2 as floating electrodes. As the dummy electrodes are disposed in the sensing area SA, the boundary area between the first sensor patterns SP1 and the second sensor patterns SP2 may not be seen by a user. In addition, a fringe effect between the first sensor patterns SP1 and the second sensor patterns SP2 may be controlled by adjusting the width and thickness of the dummy electrodes, and in this manner, the capacitance between the first sensor patterns SP1 and the second sensor patterns SP2 may be optimized.

As shown in FIG. 6, the touch sensor TS may be configured in a repetitive arrangement of a unit sensor block USB. The unit sensor block USB may be a virtual unit block having a predetermined area including at least a portion of the neighboring first sensor patterns SP1 and at least a portion of the neighboring second sensor patterns SP2. The unit sensor block USB may correspond to a minimum repeating unit of the arrangement pattern of the first and second sensor patterns SP1 and SP2. The unit sensor block USB may be a minimum unit of image capturing for inspecting defects in the touch sensor TS. Defects of the touch sensor TS may be detected by photographing an image corresponding to the unit sensor block USB for each region, and comparing the photographed images. In this case, the minimum unit of image capturing for the defect inspection may correspond to the unit sensor block USB.

According to an exemplary embodiment, the sensing lines SL may include a plurality of first sensing lines SL1 connected to the first sensor patterns SP1, and a plurality of second sensing lines SL2 connected to the second sensor patterns SP2.

The first sensing lines SL1 may be connected to the first sensor patterns SP1. Each of the first sensing lines SL1 may be connected to one sensor row formed by the plurality of first sensor patterns SP1 disposed along the first direction DR1. In a plan view, the first sensing lines SL1 may be bent at least once in the non-sensing area NSA. The first sensing lines SL1 may include a portion extending along the first direction DR1 and a portion extending along the second direction DR2.

The second sensing lines SL2 may be connected to the second sensor patterns SP2. Each of the second sensing lines SL2 may be connected to one sensor column formed by the plurality of second sensor patterns SP2 disposed along the second direction DR2. In a plan view, the second sensing lines SL2 may be bent at least once in the non-sensing area NSA. The second sensing lines SL2 may include a portion extending along the first direction DR1 and a portion extending along the second direction DR2.

The first and second sensing lines SL1 and SL2 may be made of a conductive material. As the conductive material, metals, alloys thereof, conductive polymers, conductive metal oxides, nano conductive materials, and the like may be used. In an exemplary embodiment, the metals may include copper, silver, gold, platinum, palladium, nickel, tin, aluminum, cobalt, rhodium, iridium, iron, ruthenium, osmium, manganese, molybdenum, tungsten, niobium, tantal, titanium, bismuth, antimony, lead and the like. Examples of the conductive polymer may include polythiophene-based compounds, polypyrrole-based compounds, polyaniline-based compounds, polyacetylene-based compounds, polyphenylene-based compounds, and mixtures thereof. In particular, PEDOT/PSS compounds may be used among polythiophene-based compounds. Examples of the conductive metal oxide may include indium tin oxide (ITO), indium zinc oxide (IZO), antimony zinc oxide (AZO), indium tin zinc oxide (ITZO), zinc oxide (ZnO), tin oxide ($SnO_2$), and the like. In addition, the nano conductive materials may include silver nanowires (AgNW), carbon nanotubes, graphene, and the like.

In an exemplary embodiment, the first and second sensing lines SL1 and SL2 may include a first portion formed of a double layer including one metal layer included in the first conductive pattern CP1 and the other metal layer included in the second conductive pattern CP2, and a second portion formed of a single layer including only the other metal layer. The first portion and the second portion of each of the first and second sensing lines SL1 and SL2 will be described in more detail later.

Each of the first sensor patterns SP1 may receive a driving signal for touch sensing through the corresponding first sensing line SL1, and each of the second sensor patterns SP2 may transmit a touch sensing signal through the corresponding second sensing line SL2. However, the inventive concepts are not limited thereto. For example, in some exemplary embodiments, each of the second sensor patterns SP2 may receive the driving signal for touch sensing through the corresponding second sensing line SL2, and each of the first sensor patterns SP1 may transmit the touch sensing signal through the corresponding first sensing line SL1.

Figure 9:
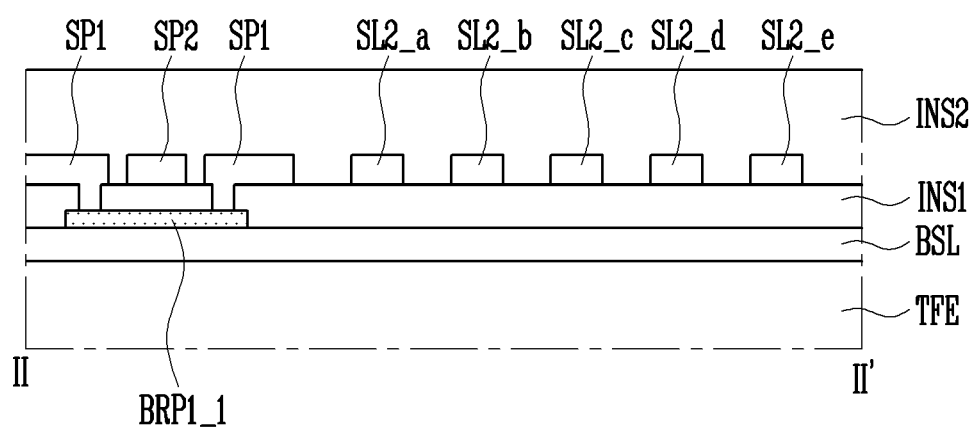
FIG. 9 is a cross-sectional view taken along line II-IP of FIG. 8.

FIG. 8 is an enlarged schematic plan view exemplarily illustrating a region EA2 of FIG. 5. FIG. 9 is a cross-sectional view taken along line II-IF of FIG. 8.

In FIG. 8, the region EA2 is shown to have the same size as the region EA1 of FIG. 6. In particular, the region EA1 and the region EA2 of FIG. 5 are shown to have the same size.

Referring to FIGS. 1A to 9, the first and second sensor patterns SP1 and SP2 and the first and second bridge patterns BRP1 and BRP2 may be disposed in the sensing area SA included in the corner portion of the touch sensor TS, and the second sensing lines SL2 may be disposed in the non-sensing area NSA included in the corner portion.

Hereinafter, the sensing area SA included in the corner portion of the touch sensor TS is referred to as a "corner portion sensing area SA", and the non-sensing area NSA included in the corner portion of the touch sensor TS is referred to as a "corner portion non-sensing area NSA".

One first bridge pattern BRP1, two first sensor patterns SP1 connected by the first bridge pattern BRP1, one second bridge pattern BRP2, and two second sensor patterns SP2 connected by the second bridge pattern BRP2 may be disposed in the corner portion sensing area SA.

According to an exemplary embodiment, the first and second sensor patterns SP1 and SP2 and the second bridge pattern BRP2 may be disposed on different layers from the first bridge pattern BRP1. For example, the first and second sensor patterns SP1 and SP2 and the second bridge pattern BRP2 may be disposed on the first bridge pattern BRP1 with the first insulating layer INS1 interposed therebetween. More particularly, the first and second sensor patterns SP1 and SP2 and the second bridge pattern BRP2 may be formed of the second conductive pattern CP2, and the first bridge pattern BRP1 may be formed of the first conductive pattern CP1.

A plurality of second sensing lines SL2 may be disposed in the corner portion non-sensing area NSA. For example, $2a^{th}$ to $2e^{th}$ sensing lines SL2_a to SL2_e may be disposed in the corner portion non-sensing area NSA.

According to an exemplary embodiment, the second sensing lines SL2 disposed in the corner portion non-sensing area NSA may be disposed on the same layer as the first and second sensor patterns SP1 and the second bridge pattern BRP2 disposed in the corner portion sensing area SA, and may include substantially the same material. For example, the second sensing lines SL2 may be formed of the second conductive pattern CP2. More particularly, the second sensing lines SL2 disposed in the corner portion non-sensing area NSA may be formed of a single layer including only the second conductive pattern CP2.

The second sensing lines SL2 disposed in the corner portion non-sensing area NSA and the first and second sensor patterns SP1 and SP2 and the first and second bridge patterns BRP1 and BRP2 disposed in the corner portion sensing area SA may be formed through a mask process using a photoresist pattern.

In general, the second sensing lines SL2 may be formed of a double layer to minimize distortion caused by signal delay. For example, the second sensing lines SL2 may be formed of a double layer including a first metal layer formed of the first conductive pattern CP1 and a second metal layer formed of the second conductive pattern CP2 and connected to the first metal layer. When the second sensing lines SL2 disposed in the corner portion non-sensing area NSA are formed of a double layer, however, there may be differences in density of the photoresist pattern between the corner portion non-sensing area NSA and the corner portion sensing area SA. For example, the amount of photoresist pattern used to form the first conductive pattern CP1 during the mask process may be greater in the corner portion non-sensing area NSA than in the corner portion sensing area SA.

In this case, a greater amount of photoresist may be dissolved during a developing process in the corner portion sensing area SA where the photoresist pattern is disposed at a lower density, than in the corner portion non-sensing area NSA where the photoresist pattern is disposed at a higher density. As such, the concentration of the developer applied to the corner portion sensing area SA may be decreased, and a concentration difference may occur between the developer applied to the corner portion sensing area SA and the developer of the corner portion non-sensing area NSA. When the concentration difference of the developer exists between the corner portion sensing area SA and the corner portion non-sensing area NSA, the high concentration developer can move toward the low concentration developer by a diffusion principle. As such, the photoresist pattern of the corner portion sensing area SA is over-developed and the thickness thereof becomes uneven, which may cause defects, for example, short defects of the first bridge pattern BRP1 including the first conductive pattern CP1, may occur in the corner portion sensing area SA.

In particular, since the first bridge pattern BRP1 disposed in the corner portion sensing area SA is closer to the second sensing lines SL2 than the first bridge pattern BRP1 disposed in the other areas except the corner portion of the touch sensor TS, the first bridge pattern BRP1 disposed in the corner sensing area SA may be further affected by a density difference of the photoresist patterns for each area. Accordingly, short defects of the first bridge pattern BRP1 disposed in the corner portion sensing area SA may occur during the mask process forming the first conductive pattern CP1 at the corner portion of the touch sensor TS.

In order to compensate for the density difference of the photoresist pattern between the corner portion sensing area SA and the corner portion non-sensing area NSA, the second sensing lines SL2 disposed in the corner portion non-sensing area NSA according to an exemplary embodiment are formed of a single layer including only the second conductive pattern CP2, instead of a double layer. In this manner, the density of the photoresist pattern may be formed uniform for each region of the touch sensor TS.

As described above, since the second sensing lines SL2 disposed in the corner portion non-sensing area NSA are formed of a single layer including only the second conductive pattern CP2, only the first bridge pattern BRP1 may be formed of the first conductive pattern CP1 among the components disposed at the corner portion of the touch sensor TS, and the remaining components may be formed of the second conductive pattern CP2. In this manner, the corner portion of the touch sensor TS may have a density of a conductive pattern (or metal pattern) that is substantially the same as or similar to that of the unit sensor block USB positioned in one area of the sensing area SA of the touch sensor TS.

Figure 10:
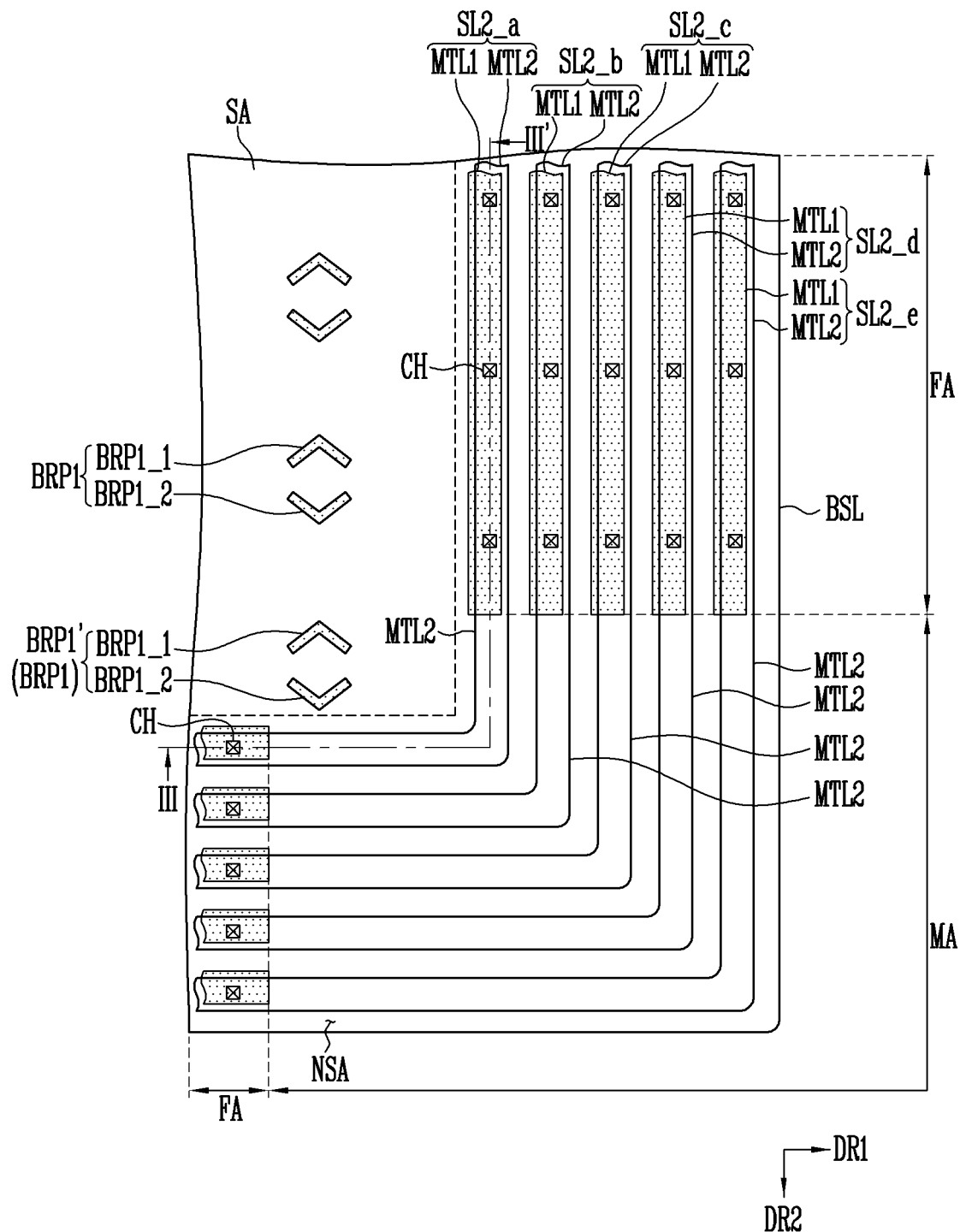
FIG. 10 is a schematic plan view of a region of a corner portion of the touch sensor of FIG. 5 illustrating only a second sensing line and a first bridge adjacent thereto.
Figure 11:
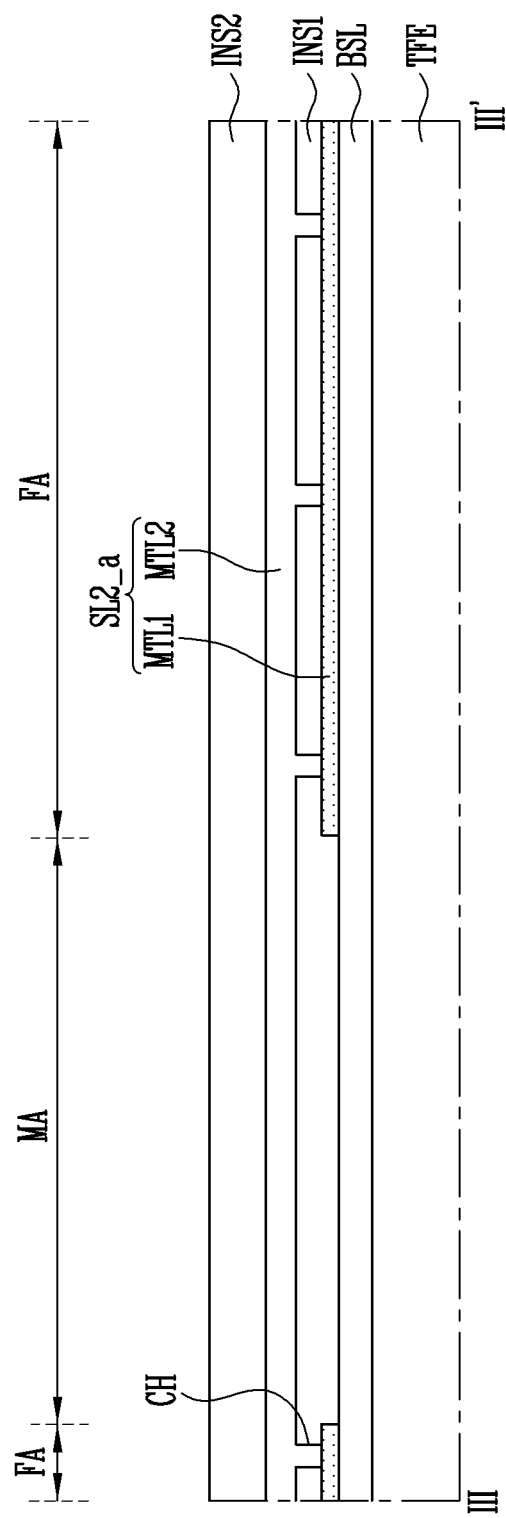
FIG. 11 is a cross-sectional view taken along line of FIG. 10.

FIG. 10 is a schematic plan view of a region of a corner portion of the touch sensor of FIG. 5 illustrating only a second sensing line and a first bridge adjacent thereto. FIG. 11 is a cross-sectional view taken along line of FIG. 10.

In FIG. 10, the first and second sensor patterns and the second bridge patterns disposed in the sensing area SA of the corner portion of the touch sensor TS are not illustrated for convenience of description.

In FIG. 10, one corner portion first bridge pattern BRP1' disposed in the sensing area SA of the corner portion of the touch sensor TS and two first bridge patterns BRP1 disposed in the same column as the corner portion first bridge pattern BRP1' are illustrated.

Referring to FIGS. 1A to 11, the corner portion of the touch sensor TS may include the corner portion sensing area SA where the corner portion first bridge pattern BRP1' is disposed, and the corner portion non-sensing area NSA where the second sensing lines SL2 are disposed. The corner portion non-sensing area NSA may surround the corner portion sensing area SA.

The corner portion first bridge pattern BRP1' may be formed of the first conductive pattern CP1 provided and/or formed on the base layer BSL. Among the first bridge patterns BRP1 disposed in the sensing area SA of the touch sensor TS, the corner portion first bridge pattern BRP1' may be a first bridge pattern BRP1 that is closest to the second sensing lines SL2.

The second sensing lines SL2 may include the $2a^{th}$ to $2e^{th}$ sensing lines SL2_a to SL2_e. Each of the $2a^{th}$ to $2e^{th}$ sensing lines SL2_a to SL2_e may include a first portion FA formed of a double layer including a first metal layer MTL1 and a second metal layer MTL2, and a second portion MA formed of a single layer including only the second metal layer MTL2.

The first portion FA of each of the $2a^{th}$ to $2e^{th}$ sensing lines SL2_a to SL2_e may be formed of a double layer including the first metal layer MTL1 and the second metal layer MTL2 provided on the first metal layer MTL1 with the first insulating layer INS1 interposed therebetween. The first metal layer MTL1 and the second metal layer MTL2 may be electrically and/or physically connected through at least one contact hole CH passing through the first insulating layer INS1. According to an exemplary embodiment, the first metal layer MTL1 may be included in the first conductive pattern CP1, and the second metal layer MTL2 may be included in the second conductive pattern CP2.

In the first portion FA of each of the $2a^{th}$ to $2e^{th}$ sensing lines SL2_a to SL2_e, the first metal layer MTL1 may have substantially the same size (or area, or length) as the adjacent first metal layer MTL1. For example, the first metal layer MTL1 included in the first portion FA of the $2a^{th}$ sensing line SL2_a may have substantially the same size (or area, or length) as that of the first metal layer MTL1 of the $2b^{th}$ sensing line SL2_b. The first metal layer MTL1 included in the first portion FA of the $2b^{th}$ sensing line SL2_b may substantially have the same size (or area, or length) as that of the first metal layer MTL1 of the $2c^{th}$ sensing line SL2_c. The first metal layer MTL1 included in the first portion FA of the $2c^{th}$ sensing line SL2_c may have substantially the same size (or area, or length) as that of the first metal layer MTL1 of the $2d^{th}$ sensing line SL2_d. The first metal layer MTL1 included in the first portion FA of the $2d^{th}$ sensing line SL2_d may have substantially the same size (or area, or length) as that the first metal layer MTL1 of the $2e^{th}$ sensing line SL2_e. According to an exemplary embodiment, the same size may include one of the same width, the same length, or the same thickness.

The second portion MA of each of the $2a^{th}$ to $2e^{th}$ sensing lines SL2_a to SL2_e may be formed of a single layer including the second metal layer MTL2. In an exemplary embodiment, the second metal layer MTL2 may be included in the second conductive pattern CP2 provided and/or formed on the first insulating layer INS1.

According to an exemplary embodiment, the first portion FA of each of the $2a^{th}$ to $2e^{th}$ sensing lines SL2_a to SL2_e may not correspond to the corner portion first bridge pattern BRP1', and the second portion MA of each of the $2a^{th}$ to $2e^{th}$ sensing lines SL2_a to SL2_e may correspond to the corner portion first bridge pattern BRP1'. More particularly, the $2a^{th}$ to $2e^{th}$ sensing lines SL2_a to SL2_e may be formed of a single layer including only the second metal layer MTL2 at a portion corresponding to the corner portion first bridge pattern BRP1', and may be formed of a double layer including the first metal layer MTL1 and the second metal layer MTL2 at a portion not corresponding to the corner portion first bridge pattern BRP1'. According to an exemplary embodiment, the second portion MA of the sensing line SL2 being "corresponding" to the corner portion first bridge pattern BRP1' may refer that the second portion MA overlap at least a portion of the first bridge pattern BRP1' along a first direction DR1 and/or a second direction DR2.

According to an exemplary embodiment, the second metal layer MTL2 included in the second portion MA of each of the $2a^{th}$ to $2e^{th}$ sensing lines SL2_a to SL2_e may have a different size (or area, or length) than that of the second metal layer MTL2 included in the second portion MA of the adjacent second sensing lines SL2. For example, the size (or area, or length) of the second metal layer MTL2 included in the second portion MA of the $2a^{th}$ sensing line SL2_a closest to the corner portion first bridge pattern BRP1' may be the smallest, and the size (or area, or length) of the second metal layer MTL2 included in the second portion MA of the $2e^{th}$ sensing line SL2_e farthest from the corner portion first bridge pattern BRP1' may be the largest. The same size may include one of the same width, the same length, or the same thickness.

As described above, at the corner portion of the touch sensor TS, only the corner portion first bridge pattern BRP1' may be formed of the first conductive pattern CP1, and other components, such as the first and second sensor patterns SP1 and SP2, the second bridge pattern BRP2, and the second portion MA of the second sensing lines SL2, may be formed of the second conductive pattern CP2.

In this case, when the first conductive pattern CP1 is formed at the corner portion of the touch sensor TS, an abrupt density difference between the photoresist pattern of the corner portion sensing area SA and the photoresist pattern of the corner portion non-sensing area NSA may be alleviated, so that the density difference in the corner portion sensing area SA and the corner portion non-sensing area NSA may be minimized. Accordingly, defects that may occur due to the density difference of the photoresist patterns in the corner portion sensing area SA and the corner portion non-sensing area NSA may be prevented or at least be suppressed. For example, short defects due to thickness unevenness of the corner portion first bridge pattern BRP1' disposed in the corner portion sensing area SA may be prevented.

In addition, since only the corner portion first bridge pattern BRP1' at the corner portion of the touch sensor TS is formed of the first conductive patterns CP1, the density of the conductive pattern per unit area between the corner portion of the touch sensor TS and the unit sensor block USB disposed in the sensing area SA except the corner portion may be similar to each other. As such, sensing sensitivity of the touch sensor TS may be increased and reliability may be improved.

Figure 12:
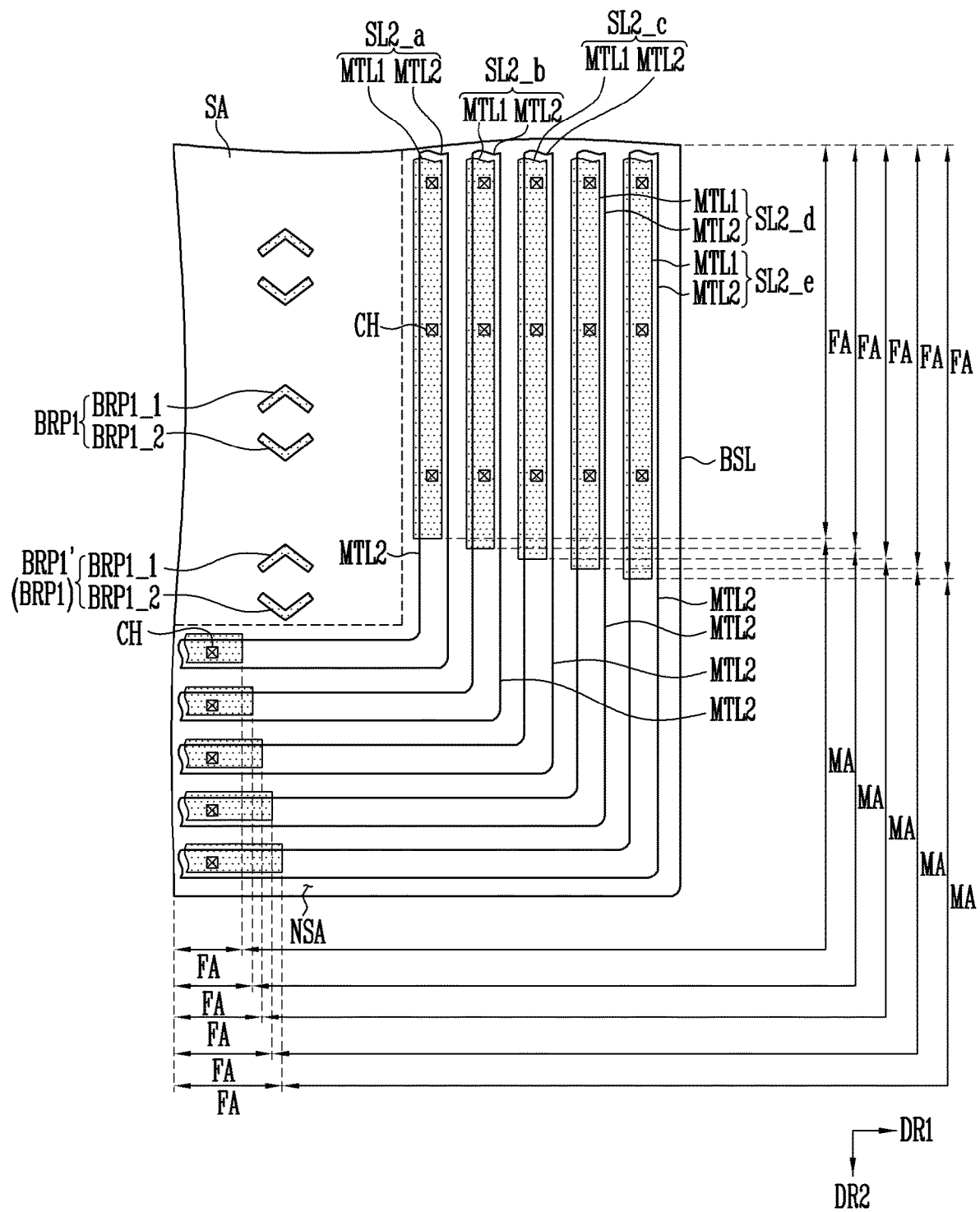
FIG. 12 is a plan view of a region of a corner portion of the touch sensor of FIG. 5 illustrating a second sensing line and a first bridge adjacent thereto according to another exemplary embodiment.

FIG. 12 is a plan view of a region of a corner portion of the touch sensor of FIG. 5 illustrating a second sensing line and a first bridge adjacent thereto according to another exemplary embodiment.

The touch sensor of FIG. 12 is substantially similar to those described above, and thus, repeated descriptions of substantially the same elements thereof will be omitted to avoid redundancy. Same reference numerals indicate same components, and similar reference numerals represent similar components.

In FIG. 12, the first and second sensor patterns and the second bridge patterns disposed in the sensing area SA of the corner portion of the touch sensor TS are not illustrated for convenience of description.

Referring to FIGS. 1A to 7A and 12, the corner portion of the touch sensor TS may include the corner portion sensing area SA in which at least one corner portion first bridge pattern BRP1' is disposed, and the corner portion non-sensing area NSA in which the second sensing lines SL2 are disposed.

The corner portion first bridge pattern BRP1' may be formed of the first conductive pattern CP1 provided and/or formed on the base layer BSL.

The second sensing lines SL2 may include the $2a^{th}$ to $2e^{th}$ sensing lines SL2_a to SL2_e. Each of the $2a^{th}$ to $2e^{th}$ sensing lines SL2_a to SL2_e may be divided into the first portion FA and the second portion MA. In an exemplary embodiment, the first portion FA of each of the $2a^{th}$ to $2e^{th}$ sensing lines SL2_a to SL2_e may not correspond or partially corresponds to the corner portion first bridge pattern BRP1', and the second portion MA of each of the $2a^{th}$ to $2e^{th}$ sensing lines SL2_a to SL2_e may correspond to the corner portion first bridge pattern BRP1'.

The first portion FA of each of the $2a^{th}$ to $2e^{th}$ sensing lines SL2_a to SL2_e may be formed of a double layer including the first metal layer MTL1 and the second metal layer MTL2 provided on the first metal layer MTL1 with the first insulating layer INS1 interposed therebetween and connected to the first metal layer MTL1 through the contact hole CH. In an exemplary embodiment, the first metal layer MTL1 may be formed of the first conductive pattern CP1, and the second metal layer MTL2 may be formed of the second conductive pattern CP2.

The second portion MA of each of the $2a^{th}$ to $2e^{th}$ sensing lines SL2_a to SL2_e may be formed of a single layer including only the second metal layer MTL2.

In the first portion FA of each of the $2a^{th}$ to $2e^{th}$ sensing lines SL2_a to SL2_e, the first metal layer MTL1 may have a different size (or area, or length) than that of the adjacent first metal layer MTL1. For example, the size (or area, or length) of the first metal layer MTL1 included in the first portion FA of the $2a^{th}$ sensing line SL2_a closest to the corner portion first bridge pattern BRP1' may be the smallest, and the size (or area, or length) of the first metal layer MTL1 included in the first portion FA of the $2e^{th}$ sensing line SL2_e farthest from the corner portion first bridge pattern BRP1' (BRP1) may be the largest. More particularly, the size (or area, or length) of the first metal layers MTL1 included in the first portion FA of the second sensing lines SL2 may be increased as the distance from the corner portion first bridge pattern BRP1' is increased. However, the inventive concepts are not limited thereto. For example, in some exemplary embodiments, the size (or area, or length) of the first metal layers MTL1 included in the first portion FA of the second sensing lines SL2 may be decreased as the distance from the corner portion first bridge pattern BRP1' is decreased.

According to an exemplary embodiment, only the corner portion first bridge pattern BRP1' may be formed of the first conductive pattern CP1 at a portion corresponding to the corner portion first bridge pattern BRP1' of the corner portion of the touch sensor TS, and the remaining components may be formed of the second conductive pattern CP2.

In this case, when the first conductive pattern CP1 is formed at the corner portion of the touch sensor TS, an abrupt density difference between the photoresist pattern of the corner portion sensing area SA and the photoresist pattern of the corner portion non-sensing area NSA may be alleviated, so that the density difference in the corner portion sensing area SA and the corner portion non-sensing area NSA may be minimized. Accordingly, short defects due to thickness unevenness of the corner portion first bridge pattern BRP1' disposed in the corner portion sensing area SA may be prevented.

Figure 13:
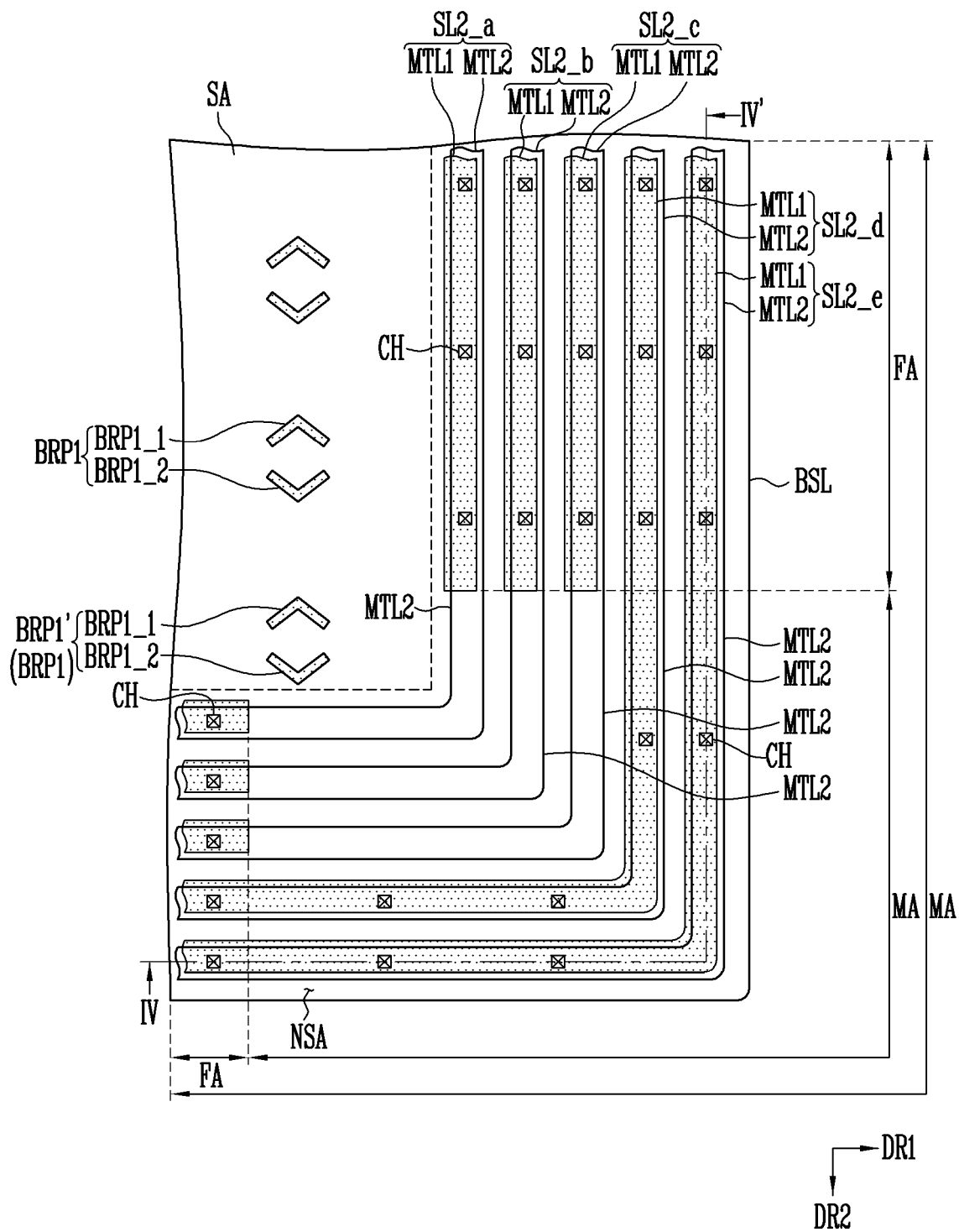
FIG. 13 is a plan view of a region of a corner portion of the touch sensor of FIG. 5 illustrating a second sensing line and a first bridge adjacent thereto according to another exemplary embodiment.
Figure 14:
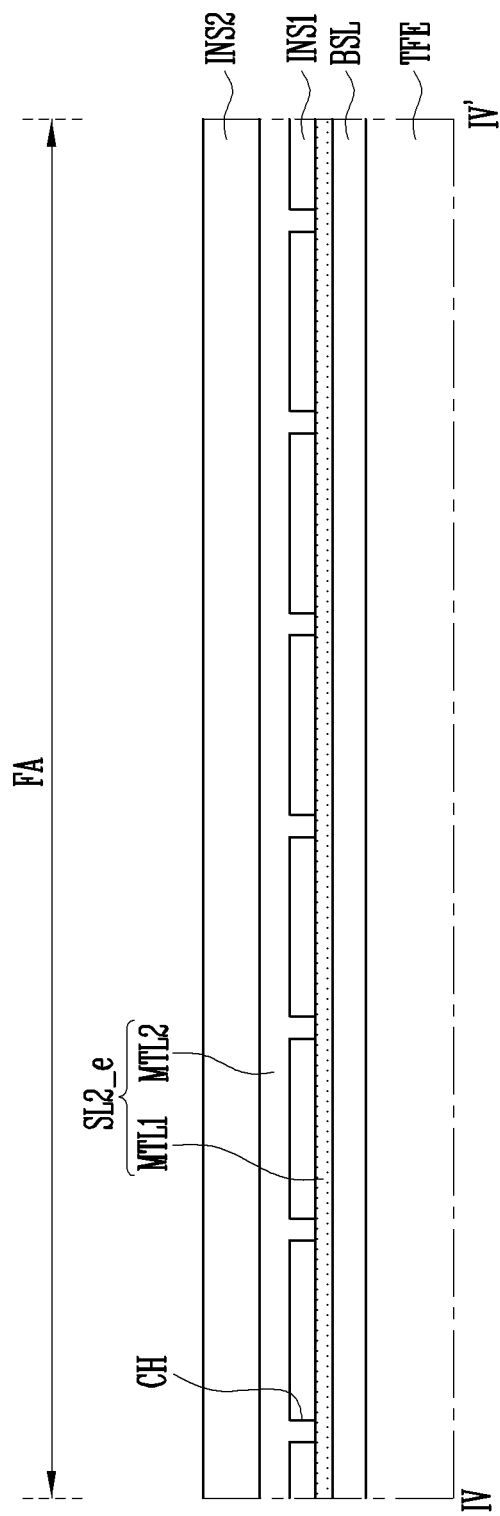
FIG. 14 is a cross-sectional view taken along line IV-IV' of FIG. 13.

FIG. 13 is a plan view of a region of a corner portion of the touch sensor of FIG. 5 illustrating a second sensing line and a first bridge adjacent thereto according to another exemplary embodiment. FIG. 14 is a cross-sectional view taken along line IV-IV' of FIG. 13.

The touch sensor of FIGS. 13 and 14 is substantially the same as those described above, and thus, repeated descriptions of substantially the same elements thereof will be omitted to avoid redundancy. Same reference numerals indicate same components, and similar reference numerals represent similar components.

In FIG. 13, the first and second sensor patterns and the second bridge patterns disposed in the sensing area SA of the corner portion of the touch sensor TS are not illustrated for convenience of description.

Referring to FIGS. 1A to 7B, 13 and 14, the corner portion of the touch sensor TS may include the corner portion sensing area SA in which at least one corner portion first bridge pattern BRP1' is disposed, and the corner portion non-sensing area NSA in which the second sensing lines SL2 are disposed.

The corner portion first bridge pattern BRP1' may be formed of the first conductive pattern CP1 provided and/or formed on the base layer BSL.

The second sensing lines SL2 may include the $2a^{th}$ to $2e^{th}$ sensing lines SL2_a to SL2_e. Some of the second sensing lines SL2 may be divided into the first portion FA formed of a double layer and the second portion MA formed of a single layer. The remaining second sensing lines SL2 may be formed of a double layer.

The first portion FA may have a double layer including the first metal layer MTL1 and the second metal layer MTL2 provided on the first metal layer MTL1 with the first insulating layer INS1 interposed therebetween and connected to the first metal layer MTL1 through the contact hole CH. The second portion MA may have a single layer including only the second metal layer MTL2. In an exemplary embodiment, the first metal layer MTL1 may be formed of the first conductive pattern CP1, and the second metal layer MTL2 may be formed of the second conductive pattern CP2.

According to the illustrated exemplary embodiment, some of the second sensing lines SL2 adjacent to the corner portion first bridge pattern BRP1' among the second sensing lines SL2 may include the first portion FA and the second portion MA, and other second sensing lines SL2 disposed far from the corner portion first bridge pattern BRP1' may include only the first portion FA. For example, among the second sensing lines SL2, the $2a^{th}$ sensing line SL2_a, the $2b^{th}$ sensing line SL2_b, and the $2c^{th}$ sensing line SL2_c, which are adjacent to the corner portion first bridge pattern BRP1', may include the first portion FA formed of a double layer including the first metal layer MTL1 and the second metal layer MTL2, and the second portion MA formed of a single layer including only the second metal layer MTL2. In addition, among the second sensing lines SL2, the $2d^{th}$ sensing line SL2_d and the $2e^{th}$ sensing line SL2_e, which are disposed far from the corner portion first bridge pattern BRP1', may include only the first portion FA formed of a double layer including the first metal layer MTL1 and the second metal layer MTL2.

When the corner portion first bridge pattern BRP1' formed of the first conductive pattern CP1 is formed, the corner portion first bridge pattern BRP1' may be further affected by the density difference of the photoresist pattern for each region by the second sensing lines SL2 closest to the corner portion first bridge pattern BRP1'. As such, according to the illustrated exemplary embodiment, some of the second sensing lines SL2 closest to the corner portion first bridge pattern BRP1' among the second sensing lines SL2 may be formed as a single layer including only the second metal layer MTL2 at a portion corresponding to the corner portion first bridge pattern BRP1'.

Figure 15:
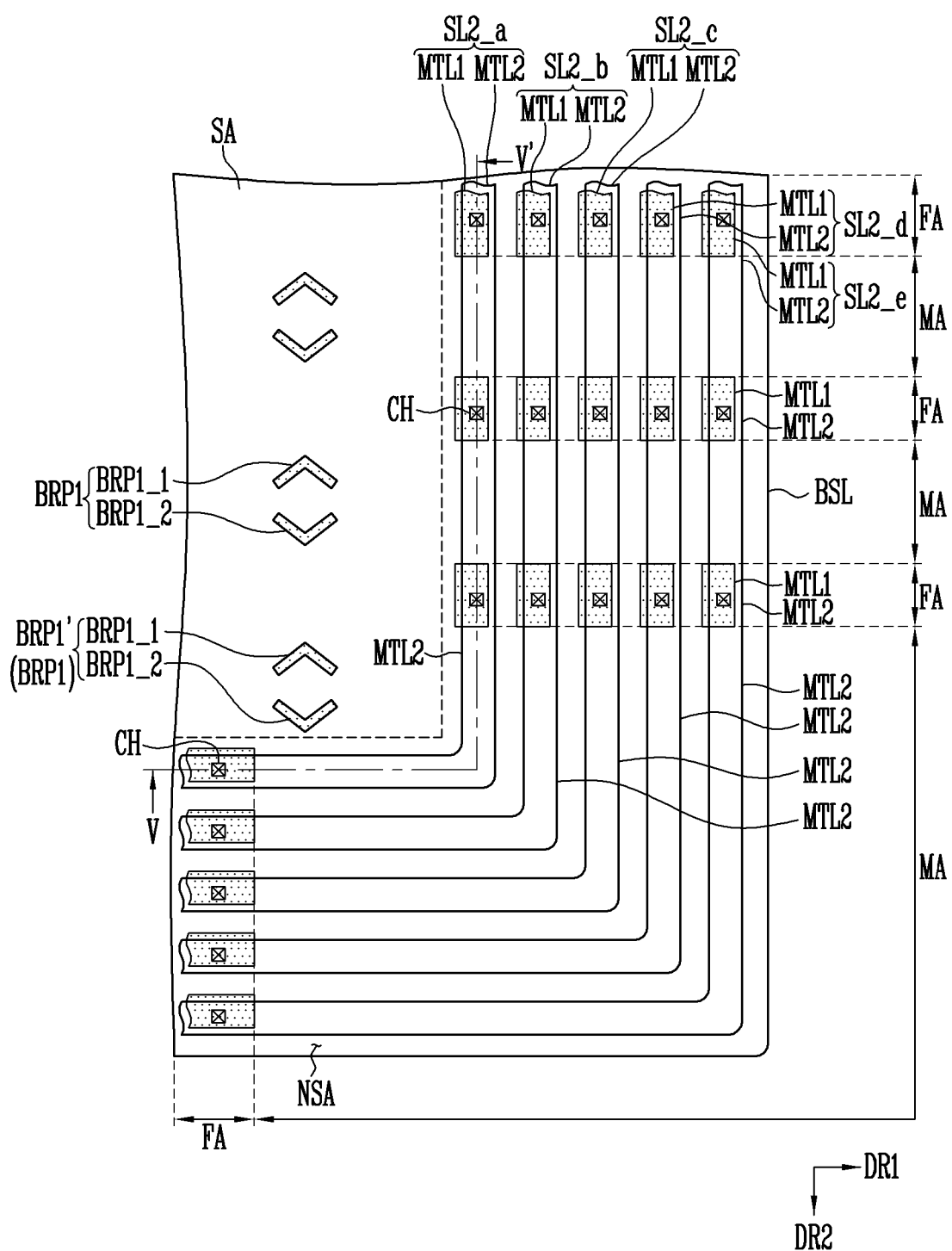
FIG. 15 is a plan view of a region of a corner portion of the touch sensor of FIG. 5 illustrating a second sensing line and a first bridge adjacent thereto according to another exemplary embodiment.
Figure 16:
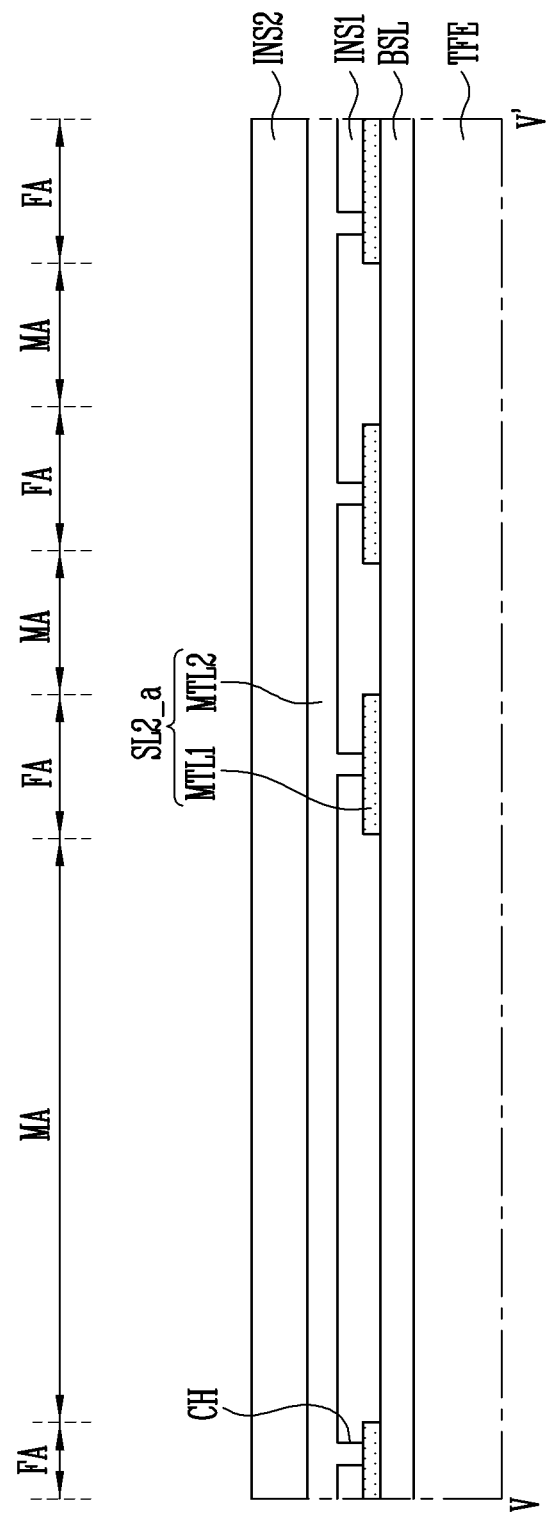
FIG. 16 is a cross-sectional view taken along line V-V' of FIG. 15.

FIG. 15 is a plan view of a region of a corner portion of the touch sensor of FIG. 5 illustrating a second sensing line and a first bridge adjacent thereto according to another exemplary embodiment. FIG. 16 is a cross-sectional view taken along the line V-V' of FIG. 15.

The touch sensor of FIGS. 15 and 16 is substantially the same as those described above, and thus, repeated descriptions of substantially the same elements thereof will be omitted. Same reference numerals indicate same components, and similar reference numerals represent similar components.

In FIG. 15, the first and second sensor patterns and the second bridge patterns disposed in the sensing area SA of the corner portion of the touch sensor TS are not illustrated for convenience of description.

Referring to FIGS. 1A to 9, 15 and 16, the corner portion of the touch sensor TS may include the corner portion sensing area SA in which at least one corner portion first bridge pattern BRP1' is disposed, and the corner portion non-sensing area NSA in which the second sensing lines SL2 are disposed.

The corner portion first bridge pattern BRP1' may be formed of the first conductive pattern CP1 provided and/or formed on the base layer BSL.

The second sensing lines SL2 may include the $2a^{th}$ to $2e^{th}$ sensing lines SL2_a to SL2_e. Each of the $2a^{th}$ to $2e^{th}$ sensing lines SL2_a to SL2_e may be divided into the first portion FA and the second portion MA.

According to an exemplary embodiment, the first portion FA of each of the $2a^{th}$ to $2e^{th}$ sensing lines SL2_a to SL2_e may not correspond to each of the corner portion first bridge pattern BRP1' and the first bridge patterns BRP1 positioned in the same row as the corner portion first bridge pattern BRP1'. In addition, the second portion MA of each of the $2a^{th}$ to $2e^{th}$ sensing lines SL2_a to SL2_e may correspond to each of the corner portion first bridge pattern BRP1' and the first bridge patterns BRP1 positioned in the same row as the corner portion first bridge pattern BRP1'.

The first portion FA of each of the $2a^{th}$ to $2e^{th}$ sensing lines SL2_a to SL2_e may be formed of a double layer including the first metal layer MTL1 and the second metal layer MTL2 provided on the first metal layer MTL1 with the first insulating layer INS1 interposed therebetween and connected to the first metal layer MTL1 through the contact hole CH. According to an exemplary embodiment, the first metal layer MTL1 may be formed of the first conductive pattern CP1, and the second metal layer MTL2 may be formed of the second conductive pattern CP2.

The second portion MA of each of the $2a^{th}$ to $2e^{th}$ sensing lines SL2_a to SL2_e may be formed of a single layer including only the second metal layer MTL2.

According an exemplary embodiment, only the corner portion first bridge pattern BRP1' and the first bridge patterns BRP1 positioned in the same row as the corner portion first bridge pattern BRP1' are formed of the first conductive pattern CP1 at the corner portion of the touch sensor TS, and the remaining components may be formed of the second conductive pattern CP2.

In the above-described exemplary embodiments, the second sensing lines SL2 of the sensing lines SL disposed in the non-sensing area NSA of the touch sensor TS are described as including the first portion FA and the second portion MA. However, the inventive concepts are not limited thereto. For example, in some exemplary embodiments, the first sensing lines SL1 may also include the first portion FA and the second portion MA, which will be described in more detail below.

Figure 17:
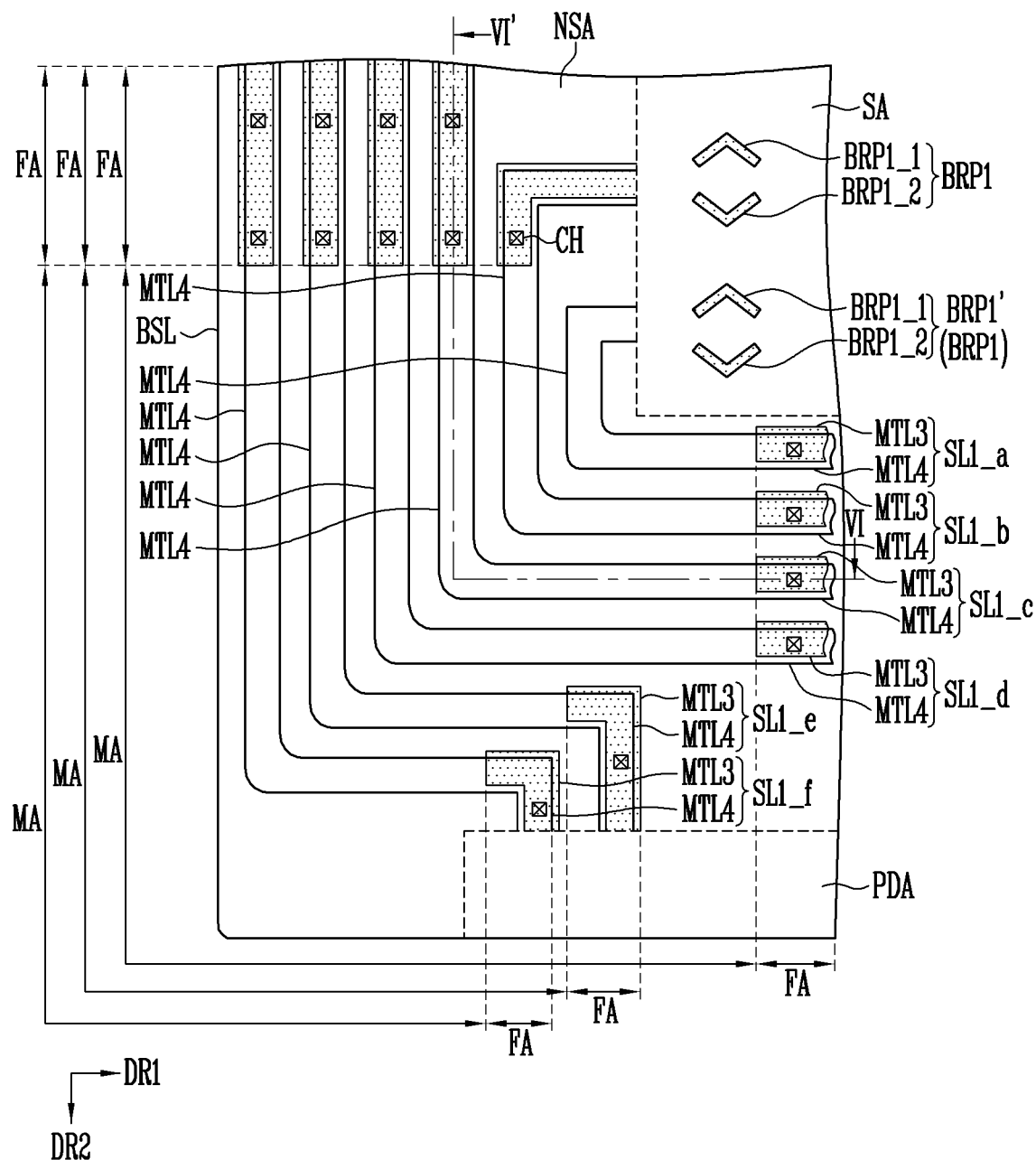
FIG. 17 is a plan view of a region of a corner portion of the touch sensor of FIG. 5 illustrating a first sensing line and a first bridge adjacent thereto.
Figure 18:
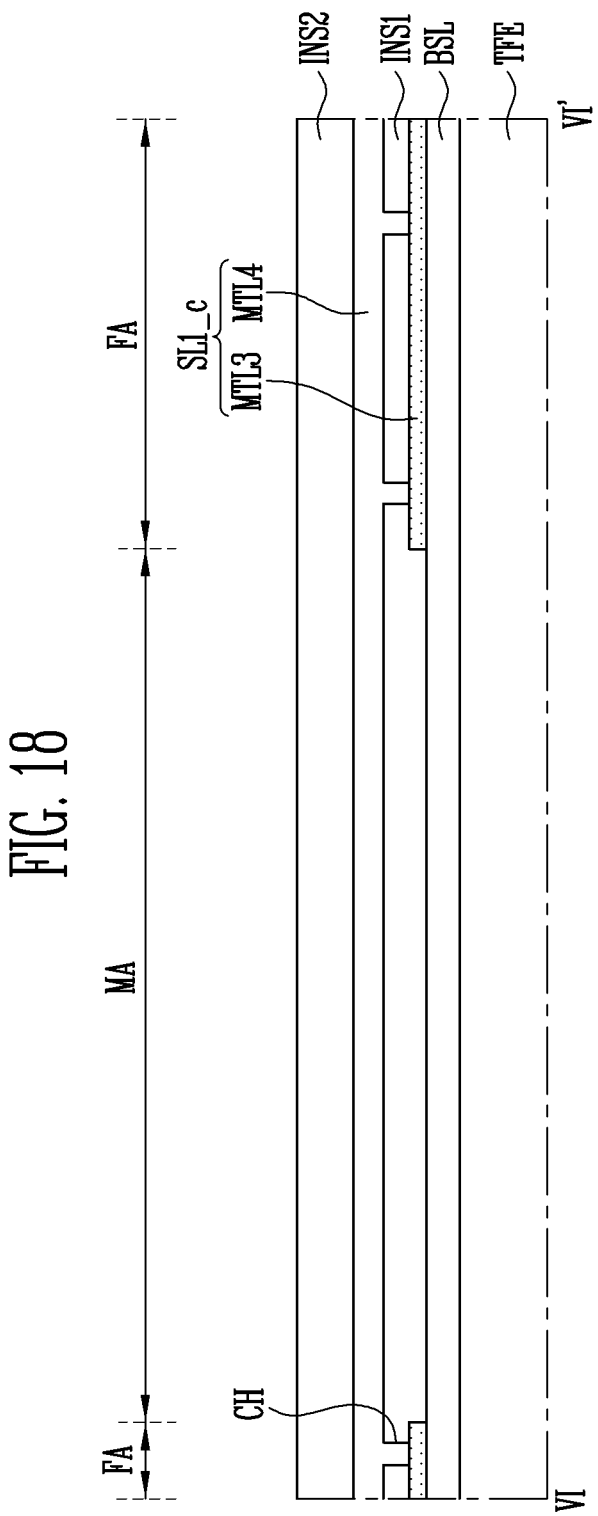
FIG. 18 is a cross-sectional view taken along line VI-VI' of FIG. 17.

FIG. 17 is a plan view of a region of a corner portion of the touch sensor of FIG. 5 illustrating a first sensing line and a first bridge adjacent thereto. FIG. 18 is a cross-sectional view taken along line VI-VI' of FIG. 17.

The touch sensor of FIGS. 17 and 18 is substantially the same as those described above. As such, repeated descriptions of the substantially the same elements thereof will be omitted. Same reference numerals indicate same components, and similar reference numerals represent similar components.

In FIG. 17, the first and second sensor patterns and the second bridge patterns disposed in the sensing area SA of the corner portion of the touch sensor TS are not illustrated for convenience of description.

Referring to FIGS. 1A to 7B, 17 and 18, the corner portion of the touch sensor TS may include the corner portion sensing area SA in which at least one corner portion first bridge pattern BRP1' is disposed, and the corner portion non-sensing area NSA in which the first sensing lines SL1 are disposed. The corner portion non-sensing area NSA may surround the corner portion sensing area SA.

The corner portion first bridge pattern BRP1' may be formed of the first conductive pattern CP1 provided and/or formed on the base layer BSL. The corner portion first bridge pattern BRP1' may be the first bridge patterns BRP1 closest to the first sensing lines SL1 among the first bridge patterns BRP1 disposed in the sensing area SA of the touch sensor TS.

The first sensing lines SL1 may include $1a^{th}$ to $1e^{th}$ sensing lines SL1_a to SL1_f. Each of the $1a^{th}$ to $1f^{th}$ sensing lines SL1_a to SL1_f may include the first portion FA formed of a double layer including a third metal layer MTL3 and a fourth metal layer MTL4, and the second portion MA formed of a single layer including only the fourth metal layer MTL4.

According to an exemplary embodiment, each of the $1a^{th}$ to $1e^{th}$ sensing lines SL1_a to SL1_f may be divided into the first portion FA and the second portion MA.

The first portion FA of each of the $1a^{th}$ to $1f^{th}$ sensing lines SL1_a to SL1_f may be formed of a double layer including the third metal layer MTL3 and the fourth metal layer MTL4 provided on the third metal layer MTL3 with the first insulating layer INS1 interposed therebetween. The third metal layer MTL3 and the fourth metal layer MTL4 may be electrically and/or physically connected through at least one contact hole CH passing through the first insulating layer INS1. The third metal layer MTL3 may be included in the first conductive pattern CP1, and the fourth metal layer MTL4 may be included in the second conductive pattern CP2.

According to an exemplary embodiment, the third metal layer MTL3 of each of the first sensing lines SL1 may be provided on the same layer as the first metal layer MTL1 (see FIG. 10) of the second sensing lines SL2. The third metal layer MTL3 of each of the first sensing lines SL1 may include substantially the same material as the first metal layer MTL1 (see FIG. 10) of the second sensing lines SL2 and may be formed through the same process. In addition, the third metal layer MTL3 of each of the first sensing lines SL1 may be provided on the same layer as the corner portion first bridge pattern BRP1'. The third metal layer MTL3 of each of the first sensing lines SL1 may include substantially the same material as the corner portion first bridge pattern BRP1' and may be formed through the same process.

The fourth metal layer MTL4 of each of the first sensing lines SL1 may be provided on the same layer as the second metal layer MTL2 (see FIG. 10) of the second sensing lines SL2. The fourth metal layer MTL4 of each of the first sensing lines SL1 may include substantially the same material as the second metal layer MTL2 (see FIG. 10) of the second sensing lines SL2 and may be formed through the same process. In addition, the fourth metal layer MTL4 of each of the first sensing lines SL1 may be provided on the same layer as the first and second sensor patterns SP1 and SP2 and the second bridge patterns BRP2 disposed in the sensing area SA of the touch sensor TS. The fourth metal layer MTL4 of each of the first sensing lines SL1 may include substantially the same material as the first and second sensor patterns SP1 and SP2 and the second bridge patterns BRP2 disposed in the sensing area SA of the touch sensor TS and may be formed through the same process.

In the first portion FA of each of the $1a^{th}$ to $1e^{th}$ sensing lines SL1_a to SL1_f, the third metal layer MTL3 may have substantially the same size (or area, or length) as the adjacent third metal layer MTL3.

The second portion MA of each of the $1a^{th}$ to $1f^{th}$ sensing lines SL1_a to SL1_f may be formed of a single layer including only the fourth metal layer MTL4.

According to an exemplary embodiment, the first portion FA of each of the $1a^{th}$ to $1f^{th}$ sensing lines SL1_a to SL1_f may not correspond to the corner portion first bridge pattern BRP1', and the second portion MA of each of the $1a^{th}$ to $1f^{th}$ sensing lines SL1_a to SL1_f may correspond to the corner portion first bridge pattern BRP1'. More particularly, the $1a^{th}$ to $1f^{th}$ sensing lines SL1_a to SL1_f may be formed of a single layer including only the fourth metal layer MTL4 at a portion corresponding to the corner portion first bridge pattern BRP1', and may be formed of a double layer including the third metal layer MTL3 and the fourth metal layer MTL4 at a portion not corresponding to the corner portion first bridge pattern BRP1'.

According to an exemplary embodiment, the fourth metal layer MTL4 included in the second portion MA of each of the $1a^{th}$ to $1f^{th}$ sensing lines SL1_a to SL1_f may have a different size (or area, or length) than that of the fourth metal layer MTL4 included in the second portion MA of the adjacent first sensing lines SL1. For example, the size (or area, or length) of the fourth metal layer MTL4 included in the second portion MA of the $1a^{th}$ sensing line SL1_a closest to the corner portion first bridge pattern BRP1' may be smallest, and the size (or area, or length) of the fourth metal layer MTL4 included in the second portion MA of the $1f^{th}$ sensing line SL1_f disposed farthest from the corner portion first bridge pattern BRP1' may be the largest. More particularly, the size (or area, or length) of the fourth metal layers MTL1 included in the second portion MA of the first sensing lines SL1 may be increased as the distance from the corner portion first bridge pattern BRP1' is increased.

As described above, only the corner portion first bridge pattern BRP1' may be formed of the first conductive pattern CP1 at the corner portion of the touch sensor TS, and the remaining components, such as the first and second sensor patterns SP1 and SP2, the second bridge pattern BRP2, and the second portion of the first sensing lines SL1, may be formed of the second conductive pattern CP2.

In this case, when the first conductive pattern CP1 is formed at the corner portion of the touch sensor TS, an abrupt density difference between the photoresist pattern of the corner portion sensing area SA and the photoresist pattern of the corner portion non-sensing area NSA may be alleviated, so that the density difference in the corner portion sensing area SA and the corner portion non-sensing area NSA may be minimized. Accordingly, defects that may occur due to the density difference of the photoresist patterns in the corner portion sensing area SA and the corner portion non-sensing area NSA may be prevented. For example, short defects due to thickness unevenness of the corner portion first bridge pattern BRP1' disposed in the corner portion sensing area SA may be prevented.

In the touch sensor according to the exemplary embodiments and the display device having the same, at least one sensing line adjacent to a bridge positioned at a corner portion of the sensing area may be formed of a single layer. In this manner, short defects of the bridge may be prevented to improve sensing sensitivity at the corner portion.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a substrate including a display area and a non-display area;
   a plurality of pixels provided in the display area of the substrate;
   an encapsulation layer disposed on the plurality of pixels;
   a first conductive pattern disposed on the encapsulation layer, the first conductive pattern including a plurality of first bridge patterns disposed in a sensing area corresponding to the display area and a first metal layer of a plurality of sensing lines disposed in a non-sensing area corresponding to the non-display area;
   a first insulating layer disposed on the first conductive pattern;
   a second conductive pattern disposed on the first insulating layer, the second conductive pattern including a plurality of first sensor patterns disposed in the sensing area, a plurality of second sensor patterns spaced apart from the plurality of first sensor patterns, a plurality of second bridge patterns intersecting the plurality of first bridge patterns, and a second metal layer of the plurality of sensing lines disposed in the non-sensing area; and
   a second insulating layer disposed on the second conductive pattern,
   wherein the second metal layer continuously extends along at least two adjacent sides of the sensing area.

2. The display device of claim 1, wherein the second metal layer partially overlaps the first metal layer with the first insulating layer interposed therebetween.

3. The display device of claim 2, wherein:
   the first insulating layer includes at least one contact hole; and
   the first metal layer and the second metal layer are directly connected to each other through the at least one contact hole.

4. The display device of claim 3, wherein:
   at least one of the plurality of first bridge patterns is disposed at a corner portion of the sensing area; and each of the plurality of sensing lines has a plurality of first portions and a second portion corresponding to the at least one of the plurality of first bridge patterns.

5. The display device of claim 4, wherein the second portion of at least one of the plurality of sensing lines has a single layer structure including only the second metal layer.

6. The display device of claim 5, wherein the plurality of first portions of the at least one of the plurality of sensing lines has a double layer structure including the first metal layer and the second metal layer overlapping the first metal layer.

7. The display device of claim 5, wherein the plurality of first portions of each of the plurality of sensing lines has a double layer structure including the first metal layer and the second metal layer disposed on the first metal layer.

8. The display device of claim 5, wherein the second portion of each of the plurality of sensing lines has a single layer structure including only the second metal layer.

9. The display device of claim 5, wherein the second portion overlaps the at least one of the plurality of first bridge patterns along a first direction.

10. The display device of claim 5, wherein:
each of the plurality of sensing lines further includes a third portion and a fourth portion extending in a first direction;
the third portion corresponds to the plurality of first bridge patterns disposed in the same column as the at least one of the plurality of first bridge patterns; and
the third portion has a single layer structure including only the second metal layer.

11. The display device of claim 10, wherein the fourth portion that does not correspond to the plurality of first bridge patterns disposed in the same column as the at least one of the plurality of first bridge patterns has a double layer structure including the first metal layer and the second metal layer disposed on the first metal layer.

12. The display device of claim 1, wherein:
the plurality of first sensor patterns are arranged along a first direction;
the plurality of second sensor patterns are arranged along a second direction crossing the first direction;
each of the plurality of first bridge patterns extends along the first direction and electrically connects two adjacent first sensor patterns; and
each of the plurality of second bridge patterns extends along the second direction and electrically connects two adjacent second sensor patterns.

13. The display device of claim 12, wherein each of the plurality of first bridge patterns includes a $(1-1)^{th}$ bridge pattern and a $(1-2)^{th}$ bridge pattern separated from the $(1-1)^{th}$ bridge pattern.

14. The display device of claim 13, wherein each of the plurality of second sensor patterns comprises:
a plurality of first conductive thin lines extending in an oblique direction with respect to the first direction; and
a plurality of second conductive thin lines intersecting the plurality of first conductive thin lines.

15. The display device of claim 1, wherein each of the plurality of pixels comprises:
a pixel circuit layer disposed on the substrate and including at least one transistor; and
a display element layer disposed on the pixel circuit layer and including a light emitting element emitting light, and
wherein the encapsulation layer is disposed on the display element layer.

16. The display device of claim 15, wherein the light emitting element comprises:
a first electrode disposed on the pixel circuit layer and electrically connected to the at least one transistor;
an emission layer disposed on the first electrode; and
a second electrode disposed on the emission layer.

* * * * *